United States Patent
Li et al.

(10) Patent No.: US 8,443,250 B2
(45) Date of Patent: May 14, 2013

(54) SYSTEMS AND METHODS FOR ERROR CORRECTION USING IRREGULAR LOW DENSITY PARITY CHECK CODES

(75) Inventors: Zongwang Li, San Jose, CA (US); Yang Han, Sunnyvale, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 325 days.

(21) Appl. No.: 12/901,816

(22) Filed: Oct. 11, 2010

(65) Prior Publication Data

US 2012/0089883 A1    Apr. 12, 2012

(51) Int. Cl.
    *H03M 13/00*    (2006.01)
(52) U.S. Cl.
    USPC .......................................... 714/752; 714/758
(58) Field of Classification Search .................. 714/752, 714/758
    See application file for complete search history.

(56) References Cited

U.S. PATENT DOCUMENTS

| | | |
|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |

(Continued)

FOREIGN PATENT DOCUMENTS

| | | |
|---|---|---|
| EP | 0522578 | 1/1993 |
| EP | 1814108 | 8/2007 |

(Continued)

OTHER PUBLICATIONS

K. Gunnam et al., "Value-Reuse Properties of Min-Sum for GF(q)" (dated Oct. 2006) Dept. of ECE, Texas A&M University Technical Note, published about Aug. 2010.

(Continued)

*Primary Examiner* — Sam Rizk
(74) *Attorney, Agent, or Firm* — Hamilton DeSancits & Cha

(57) ABSTRACT

Various embodiments of the present invention provide systems and methods for generating a code format. One method discussed includes: receiving a first matrix having a row width and a column height that is greater than one; incorporating a circulant into a first column of the first matrix; testing the first column for trapping sets, wherein at least one trapping set is identified; selecting a value to mitigate the identified trapping set; and augmenting the first matrix with a second matrix to yield a composite matrix. The second matrix has the selected value in the first column, and wherein the identified trapping set is mitigated.

20 Claims, 19 Drawing Sheets

U.S. PATENT DOCUMENTS

| | | | |
|---|---|---|---|
| 6,065,149 | A | 5/2000 | Yamanaka |
| 6,097,764 | A | 8/2000 | McCallister et al. |
| 6,145,110 | A | 11/2000 | Khayrallah |
| 6,216,249 | B1 | 4/2001 | Bliss et al. |
| 6,216,251 | B1 | 4/2001 | McGinn |
| 6,229,467 | B1 | 5/2001 | Eklund et al. |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,381,726 | B1 | 4/2002 | Weng |
| 6,438,717 | B1 | 8/2002 | Butler et al. |
| 6,473,878 | B1 | 10/2002 | Wei |
| 6,476,989 | B1 | 11/2002 | Chainer et al. |
| 6,625,775 | B1 | 9/2003 | Kim |
| 6,657,803 | B1 | 12/2003 | Ling et al. |
| 6,671,404 | B1 | 12/2003 | Katawani et al. |
| 6,748,034 | B2 | 6/2004 | Hattori et al. |
| 6,757,862 | B1 | 6/2004 | Marianetti, II |
| 6,785,863 | B2 | 8/2004 | Blankenship et al. |
| 6,788,654 | B1 | 9/2004 | Hashimoto et al. |
| 6,810,502 | B2 | 10/2004 | Eidson |
| 6,980,382 | B2 | 12/2005 | Hirano et al. |
| 6,986,098 | B2 | 1/2006 | Poeppelman et al. |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,073,118 | B2 | 7/2006 | Greenberg et al. |
| 7,093,179 | B2 | 8/2006 | Shea |
| 7,113,356 | B1 | 9/2006 | Wu |
| 7,173,783 | B1 | 2/2007 | McEwen et al. |
| 7,184,486 | B1 | 2/2007 | Wu et al. |
| 7,191,378 | B2 | 3/2007 | Eroz et al. |
| 7,203,015 | B2 | 4/2007 | Sakai et al. |
| 7,203,887 | B2 | 4/2007 | Eroz et al. |
| 7,236,757 | B2 | 6/2007 | Raghaven et al. |
| 7,257,764 | B2 | 8/2007 | Suzuki et al. |
| 7,310,768 | B2 | 12/2007 | Eidson et al. |
| 7,313,750 | B1 | 12/2007 | Feng et al. |
| 7,370,258 | B2 | 5/2008 | Iancu et al. |
| 7,403,752 | B2 | 7/2008 | Raghaven et al. |
| 7,430,256 | B2 | 9/2008 | Zhidkov |
| 7,502,189 | B2 | 3/2009 | Sawaguchi et al. |
| 7,505,537 | B1 | 3/2009 | Sutardja |
| 7,523,375 | B2 | 4/2009 | Spencer |
| 7,587,657 | B2 | 9/2009 | Haratsch |
| 7,590,168 | B2 | 9/2009 | Raghaven et al. |
| 7,702,989 | B2 | 4/2010 | Graef et al. |
| 7,712,008 | B2 | 5/2010 | Song et al. |
| 7,752,523 | B1 | 7/2010 | Chaichanavong |
| 7,801,200 | B2 | 9/2010 | Tan |
| 7,802,163 | B2 | 9/2010 | Tan |
| 8,127,209 | B1 * | 2/2012 | Zhang et al. ............... 714/780 |
| 2003/0063405 | A1 | 4/2003 | Jin et al. |
| 2003/0081693 | A1 | 5/2003 | Raghaven et al. |
| 2003/0087634 | A1 | 5/2003 | Raghaven et al. |
| 2003/0112896 | A1 | 6/2003 | Raghaven et al. |
| 2003/0134607 | A1 | 7/2003 | Raghaven et al. |
| 2004/0071206 | A1 | 4/2004 | Takatsu |
| 2004/0098659 | A1 | 5/2004 | Bjerke et al. |
| 2005/0010855 | A1 | 1/2005 | Lusky |
| 2005/0111540 | A1 | 5/2005 | Modrie et al. |
| 2005/0157780 | A1 | 7/2005 | Werner et al. |
| 2005/0195749 | A1 | 9/2005 | Elmasry et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0123285 | A1 | 6/2006 | De Araujo et al. |
| 2006/0140311 | A1 | 6/2006 | Ashley et al. |
| 2006/0168493 | A1 | 7/2006 | Song |
| 2006/0195772 | A1 | 8/2006 | Graef et al. |
| 2006/0248435 | A1 | 11/2006 | Haratsch |
| 2006/0256670 | A1 | 11/2006 | Park et al. |
| 2007/0011569 | A1 | 1/2007 | Vila Casado et al. |
| 2007/0047635 | A1 | 3/2007 | Stojanovic et al. |
| 2007/0110200 | A1 | 5/2007 | Mergen et al. |
| 2007/0230407 | A1 | 10/2007 | Petrie et al. |
| 2007/0286270 | A1 | 12/2007 | Huang et al. |
| 2008/0049825 | A1 | 2/2008 | Chen et al. |
| 2008/0055122 | A1 | 3/2008 | Tan |
| 2008/0065970 | A1 | 3/2008 | Tan |
| 2008/0069373 | A1 | 3/2008 | Jiang et al. |
| 2008/0168330 | A1 | 7/2008 | Graef et al. |
| 2008/0276156 | A1 | 11/2008 | Gunnam |
| 2008/0301521 | A1 | 12/2008 | Gunnam |
| 2009/0199071 | A1 | 8/2009 | Graef |
| 2009/0235116 | A1 | 9/2009 | Tan et al. |
| 2009/0235146 | A1 | 9/2009 | Tan et al. |
| 2009/0259915 | A1 | 10/2009 | Livshitz et al. |
| 2009/0273492 | A1 | 11/2009 | Yang et al. |
| 2009/0274247 | A1 | 11/2009 | Galbraith et al. |
| 2010/0002795 | A1 | 1/2010 | Raghaven et al. |
| 2010/0050043 | A1 | 2/2010 | Savin |
| 2010/0061492 | A1 | 3/2010 | Noelder |
| 2010/0070837 | A1 | 3/2010 | Xu et al. |
| 2010/0164764 | A1 | 7/2010 | Nayak |
| 2010/0185914 | A1 | 7/2010 | Tan et al. |
| 2011/0083058 | A1 * | 4/2011 | Hu et al. ............... 714/758 |

FOREIGN PATENT DOCUMENTS

| | | |
|---|---|---|
| WO | WO 2006/016751 | 2/2006 |
| WO | WO 2006/134527 | 12/2006 |
| WO | WO 2007/091797 | 8/2007 |

OTHER PUBLICATIONS

K. Gunnam et al., "Value-Reuse Properties of Min-Sum for GF(q)"(dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

U.S. Appl. No. 11/461,026, filed Jul. 31, 2006, Tan, Weijun.
U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,330, filed Sep. 21, 2010, Zhang, et al.
U.S. Appl. No. 12/887,369, filed Sep. 21, 2010, Liu et al.
U.S. Appl. No. 12/917,756, filed Nov. 2, 2010, Miladinovic et al.
U.S. Appl. No. 12/974,931, filed Nov. 17, 2010, Yang, Shaohua.
U.S. Appl. No. 12/947,947, filed Nov. 17, 2010, Ivkovic et al.

Casado et al., Multiple-rate low-denstiy parity-check codes with constant blocklength, IEEE Transations on communications, Jan. 2009, vol. 57, pp. 75-83.

Collins and Hizlan, "Determinate State Convolutional Codes" IEEE Transactions on Communications, Dec. 1993.

Eleftheriou et al., "Low Density Parity-Check Codes for Digital Subscriber Lines", Proc ICC 2002, pp. 1752-1757.

Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.

Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.

Gunnam, K et al. "Tech. Note on Iterative LDPC Solutions for Turbo Equal.", K. Gunnam, G. Choi and M. Yeary, TX A&M Tech. Note, Rpt. Dt: Jul. 2006 Avail. online dropzone.tamu.edu.

K. Gunnam et al., Next Generation iterative LDPC solutions for magnetic recording storage, invited paper. The Asilomar Conference on Signals, Systems, and Computers, Nov. 2008.

Han and Ryan, "Pinning Techniques for Low-Floor Detection/Decoding of LDPC-Coded Partial Response Channels", 5th International Symposium on Turbo Codes &Related Topics, 2008.

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Mohsenin et al., "Split Row: A Reduced Complexity, High Throughput LDPC Decoder Architecture", pp. 1-6, printed from www.ece.ucdavis.edu on Jul. 9, 2007.

Sari H et al., "Transmission Techniques for Digital Terrestrial TV Broadcasting" IEEE Communications Magazine, IEEE Service Center Ny, NY vol. 33, No. 2 Feb. 1995.

Unk, "Auto threshold and Auto Local Threshold" [online] [retr. May 28, 2010] Retr. from the Internet www.dentristy.bham.ac.uk/landinig/software/autothreshold/autothreshold.html.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Wang Y et al., "A Soft Decision Decoding Scheme for Wireless COFDM With App. to DVB-T" IEEE Transactions on Consumer elect., IEEE Service Center, NY,NY vo. 50, No. 1 Feb. 2004.

Weon-Cheol L. et al., "Vitierbi Decoding Method Using Channel State Information in COFDM System" IEEE Trans. on Consumer Elect., IEEE Service Center, NY, NY vol. 45 No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

Youn, "BER Perf. Due to Irreg. of Row-Weoght Distr. of the Parity-Check Matirx in Irregular LDPC Codes for 10-Gb/s Optical Signals" Journal of Lightwave Tech., vol. 23 Sep. 9, 2005.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. On Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC Techron, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

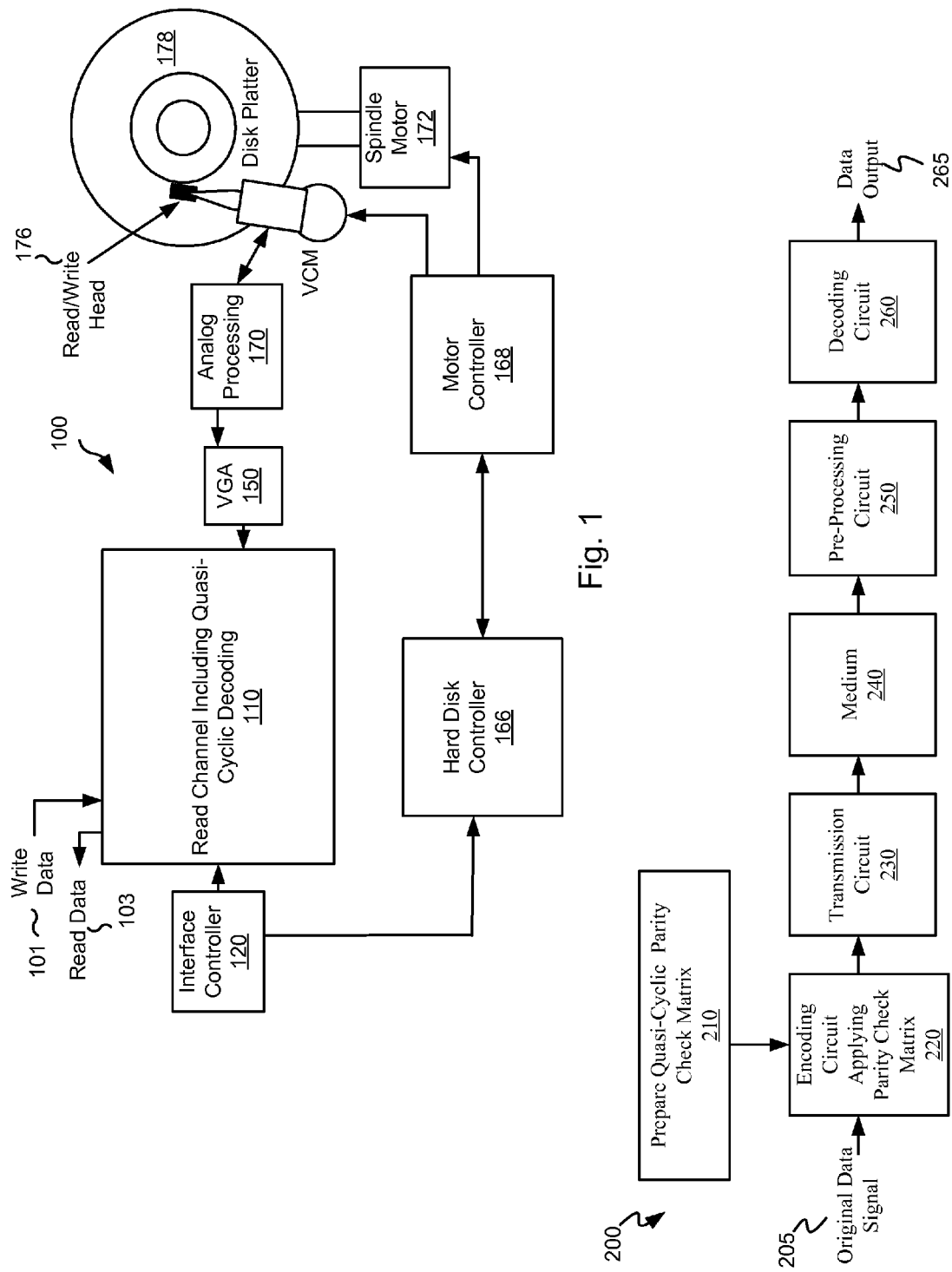

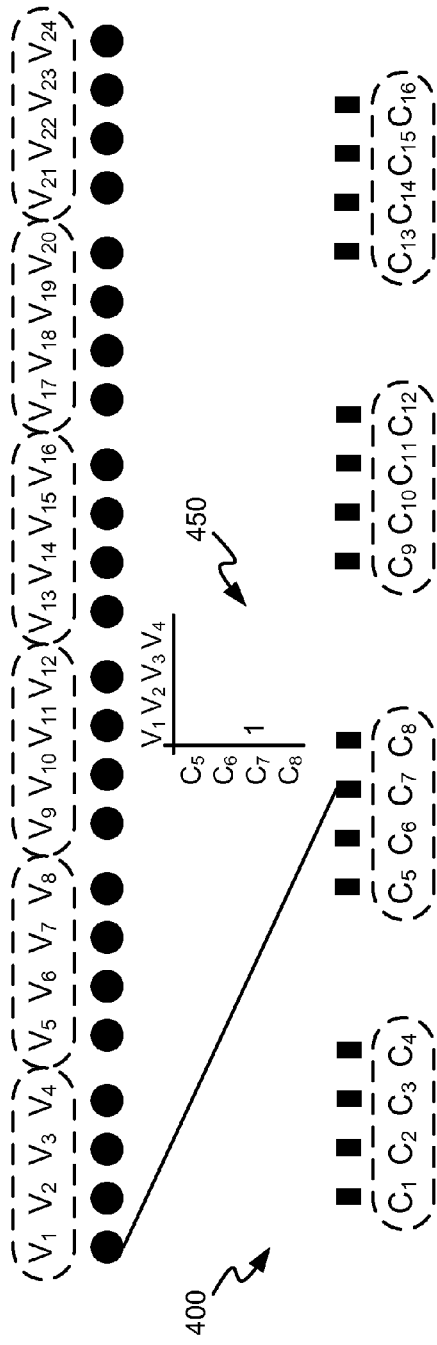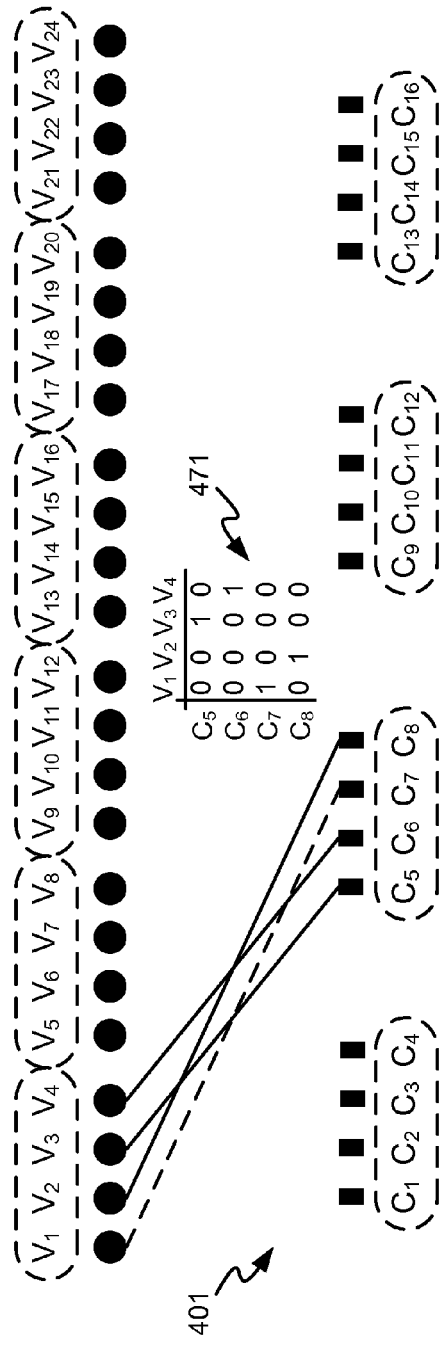
Fig. 4a
Fig. 4b

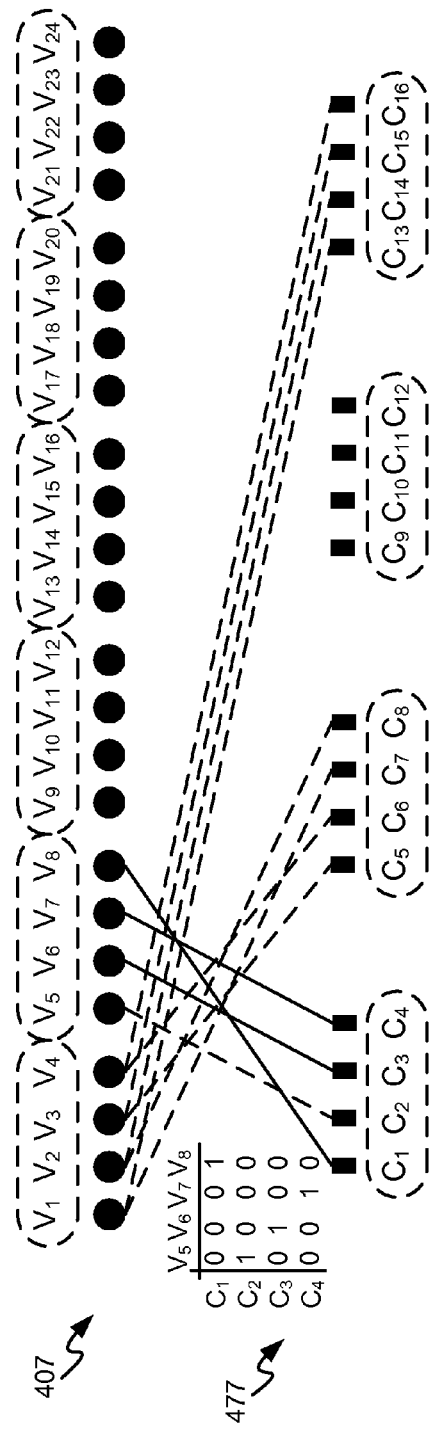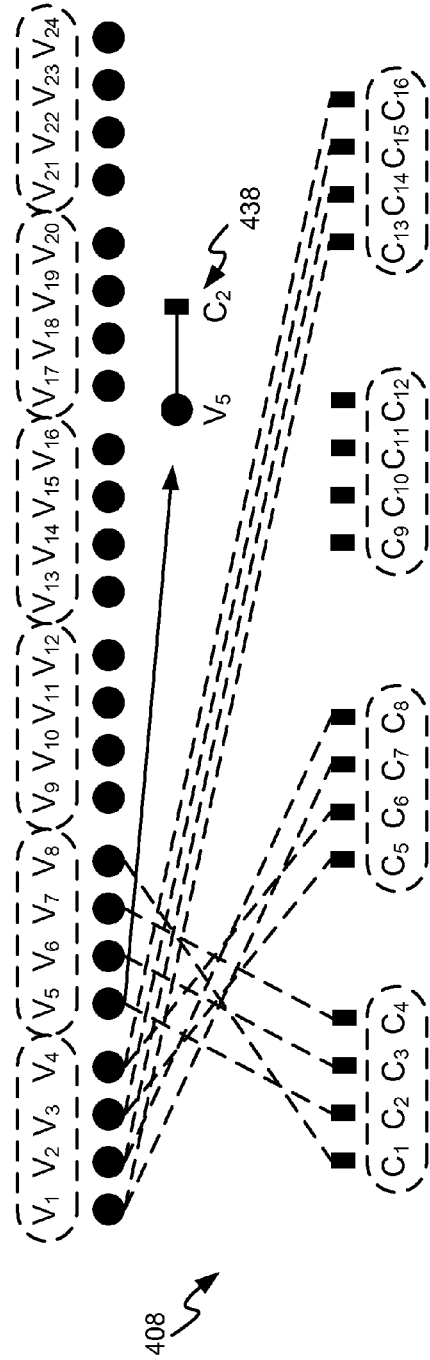

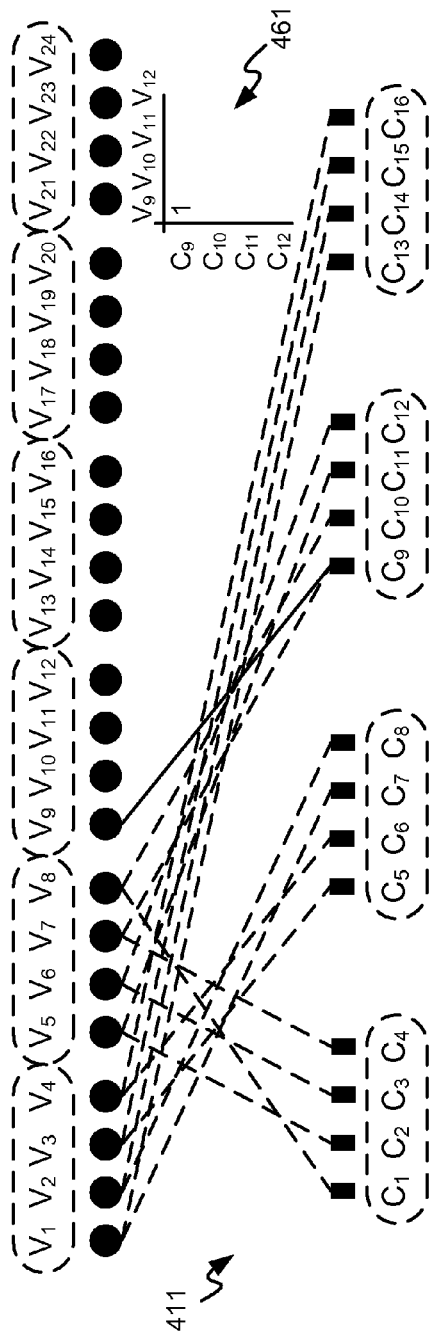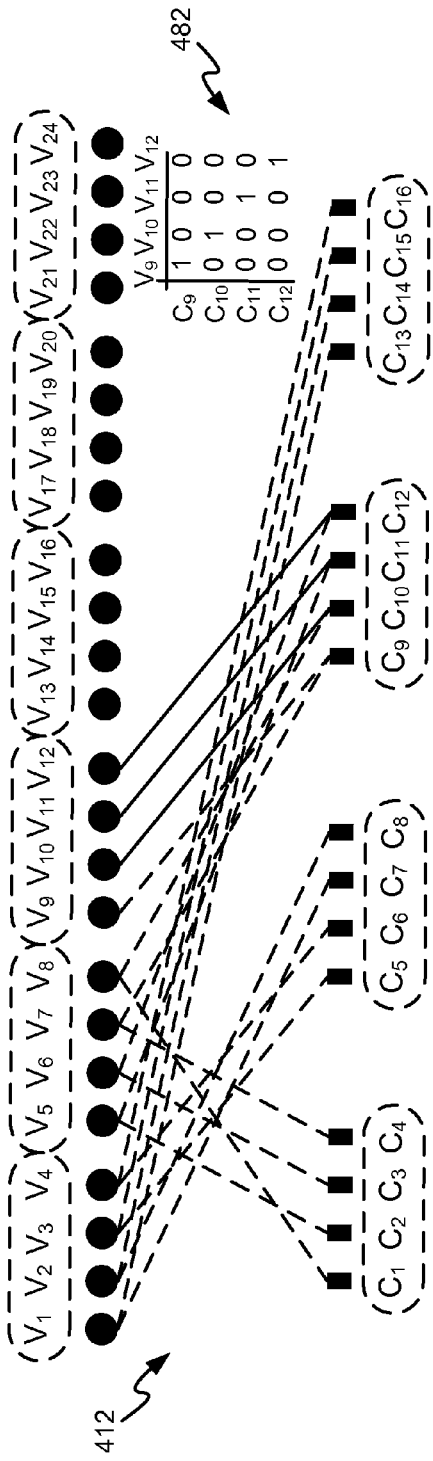

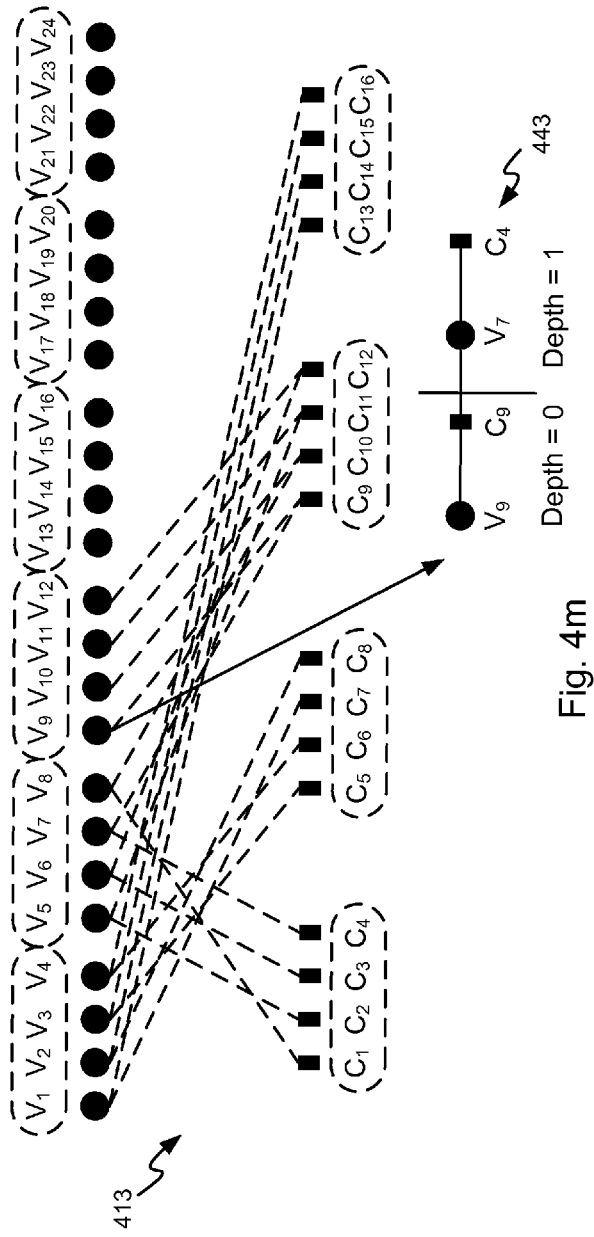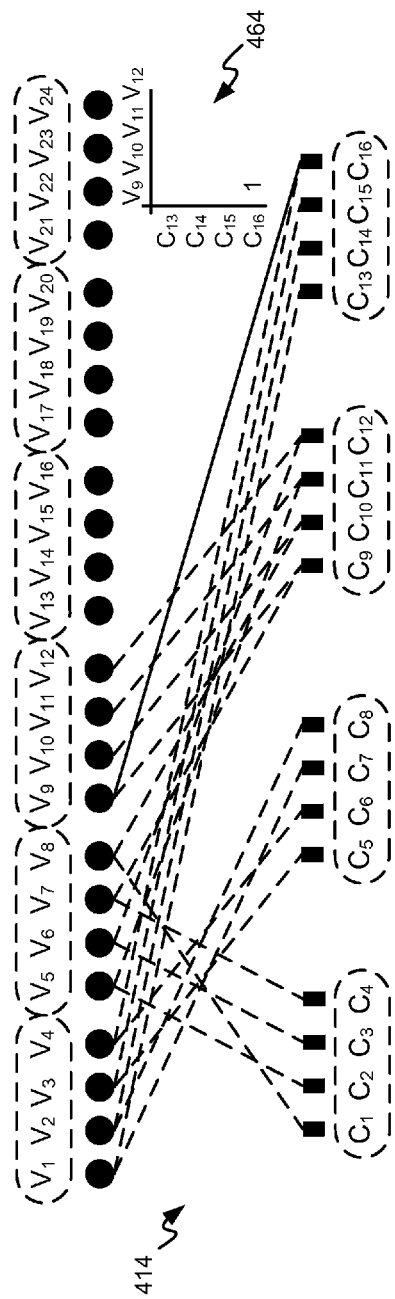
Fig. 4m
Fig. 4n $$H_1 = \begin{bmatrix} P_{1,1} & 0 & P_{1,3} & P_{1,4} & 0 & \ldots & P_{1,J} \\ 0 & P_{1,2} & 0 & 0 & P_{1,5} & \ldots & 0 \\ 0 & P_{2,2} & P_{2,3} & P_{2,4} & P_{2,5} & \ldots & P_{2,J} \\ P_{2,1} & 0 & 0 & 0 & 0 & \ldots & 0 \end{bmatrix}$$

700

$$H_2 = \begin{bmatrix} P_{3,1}+R_1 & P_{3,2} & P_{3,3}+R_3 & R_4 & P_{3,5}+R_5 & \ldots & R_J \end{bmatrix}$$

705

$$R_J = \begin{bmatrix} q^{J+0}_{p_1 \times p_1} & 0_{(p-p_1) \times p} & q^{J+1}_{p_1 \times p_1} & \ldots & q^{J+k}_{p_1 \times p_1} \end{bmatrix}$$

710

$$q = \begin{bmatrix} 0 & 0 & \ldots & 0 & 1 & 0 \\ 1 & 0 & \ldots & 0 & 0 & 0 \\ 0 & 1 & \ldots & 0 & 0 & 1 \\ \vdots & \vdots & \ddots & \vdots & \vdots & \vdots \\ 0 & 0 & \ldots & 0 & 1 & 0 \\ 1 & 0 & \ldots & 0 & 0 & 0 \end{bmatrix}$$

715

Fig. 7a $$H_1 = \begin{bmatrix} P_{1,1} & 0 & P_{1,2} & P_{1,3} & P_{1,4} & 0 & \cdots & P_{1,J} \\ 0 & P_{2,2} & 0 & 0 & 0 & P_{1,5} & \cdots & 0 \\ 0 & 0 & P_{2,3} & P_{2,4} & 0 & P_{2,5} & \cdots & P_{2,J} \\ P_{2,1} & 0 & 0 & P_{3,4} & 0 & 0 & \cdots & 0 \\ 0 & P_{3,2} & 0 & 0 & 0 & 0 & \cdots & P_{3,J} \end{bmatrix}$$ 750

$$H_2 = \begin{bmatrix} R_1 & R_2 & R_3 & R_4 & R_5 & \cdots & R_J \end{bmatrix}$$ 755

760

$$R_J = \begin{bmatrix} q^{J+0}_{p1 \times p1} & q^{J+1}_{p1 \times p1} & \cdots & q^{J+k}_{p1 \times p1} \end{bmatrix}$$

$$q = \begin{bmatrix} 0 & 0 & \cdots & 0 & 1 & 0 \\ 0 & 0 & \cdots & 0 & 0 & 0 \\ \vdots & \vdots & & \vdots & \vdots & \vdots \\ 0 & 1 & \cdots & 0 & 0 & 1 \\ 1 & 0 & \cdots & 0 & 0 & 0 \end{bmatrix}$$ 765

Fig. 7b

SYSTEMS AND METHODS FOR ERROR CORRECTION USING IRREGULAR LOW DENSITY PARITY CHECK CODES

BACKGROUND OF THE INVENTION

The present inventions are related to systems and methods for data processing, and more particularly to LDPC based data processing.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In such systems, errors are introduced to the data during the transmission and recovery processes. In some cases, such errors can be detected by applying encoding/decoding techniques such as low density parity check encoding/decoding. In some cases such encoding/decoding techniques may require complex and power intense functionality. Further, in some cases, errors may be introduced by the encoding/decoding techniques in the form of trapping sets.

Hence, there exists a need in the art for advanced systems and methods for error correction in data processing systems.

BRIEF SUMMARY OF THE INVENTION

The present inventions are related to systems and methods for data processing, and more particularly to LDPC based data processing.

Various embodiments of the present invention provides methods for generating a code format. Such methods include: receiving a first matrix having a row width and a column height that is greater than one; incorporating a circulant into a first column of the first matrix; testing the first column for trapping sets, wherein at least one trapping set is identified; selecting a value to mitigate the identified trapping set; and augmenting the first matrix with a second matrix to yield a composite matrix. The second matrix has the selected value in the first column, and wherein the identified trapping set is mitigated. In some cases, the second matrix has the same column width, and the second matrix has a row height equal to one. In particular cases, the methods are at least in part performed by a processor executing instructions. In various cases, the methods are at least in part performed by an integrated circuit.

In various instances of the aforementioned embodiments, the value is another circulant. In some instances of the aforementioned embodiments, testing the first column for trapping sets yields a single trapping set. The methods further include incorporating another circulant into the first column of the first matrix; re-testing the first column for trapping sets where more than one trapping sets are identified; and selecting the first circulant for inclusion in the first column based at least in part on the single trapping set compared with the more than one trapping set. In other instances of the aforementioned embodiments, selecting the value to mitigate the identified trapping set includes: selecting a first circulant as the value; testing the composite matrix for trapping sets wherein a first number of trapping sets are identified; selecting a second circulant as the value; re-testing the composite matrix for trapping sets wherein a second number of trapping sets are identified; and selecting one of the first circulant and the second circulant as the value based on a comparison of the first number of trapping sets and the second number of trapping sets.

Other embodiments of the present invention provide systems for generating a code format. Such systems include a computer readable medium having instructions executable by a processor to: receive a first matrix having a row width and a column height of greater than one; incorporate a circulant into a first column of the first matrix; test the first column for trapping sets such that at least one trapping set is identified; select a value to mitigate the identified trapping set; and augment the first matrix with a second matrix to yield a composite matrix. The second matrix has the selected value in the first column, and the identified trapping set is mitigated.

Yet other embodiments of the present invention provide systems for generating a code format. Such systems include a computer readable medium having instructions executable by a processor, and an integrated circuit. The combination of the instructions executable by the processor and the integrated circuit are operable to: receive a first matrix having a row width and a column height of greater than one; incorporate a circulant into a first column of the first matrix; test the first column for trapping sets such that at least one trapping set is identified; select a value to mitigate the identified trapping set; and augment the first matrix with a second matrix to yield a composite matrix. The second matrix has the selected value in the first column, and the identified trapping set is mitigated.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 shows a storage system including a read channel module that includes quasi-cyclic encoding/decoding and trapping set mitigation in accordance with one or more embodiments of the present invention;

FIG. 2 depicts a data is a data processing system relying on quasi-cyclic decoding in accordance with various embodiments of the present invention;

FIGS. 7a-7b show LDPC code structures that may be used in relation to one or more embodiments of the present invention;

DETAILED DESCRIPTION OF THE INVENTION

Figure 3:
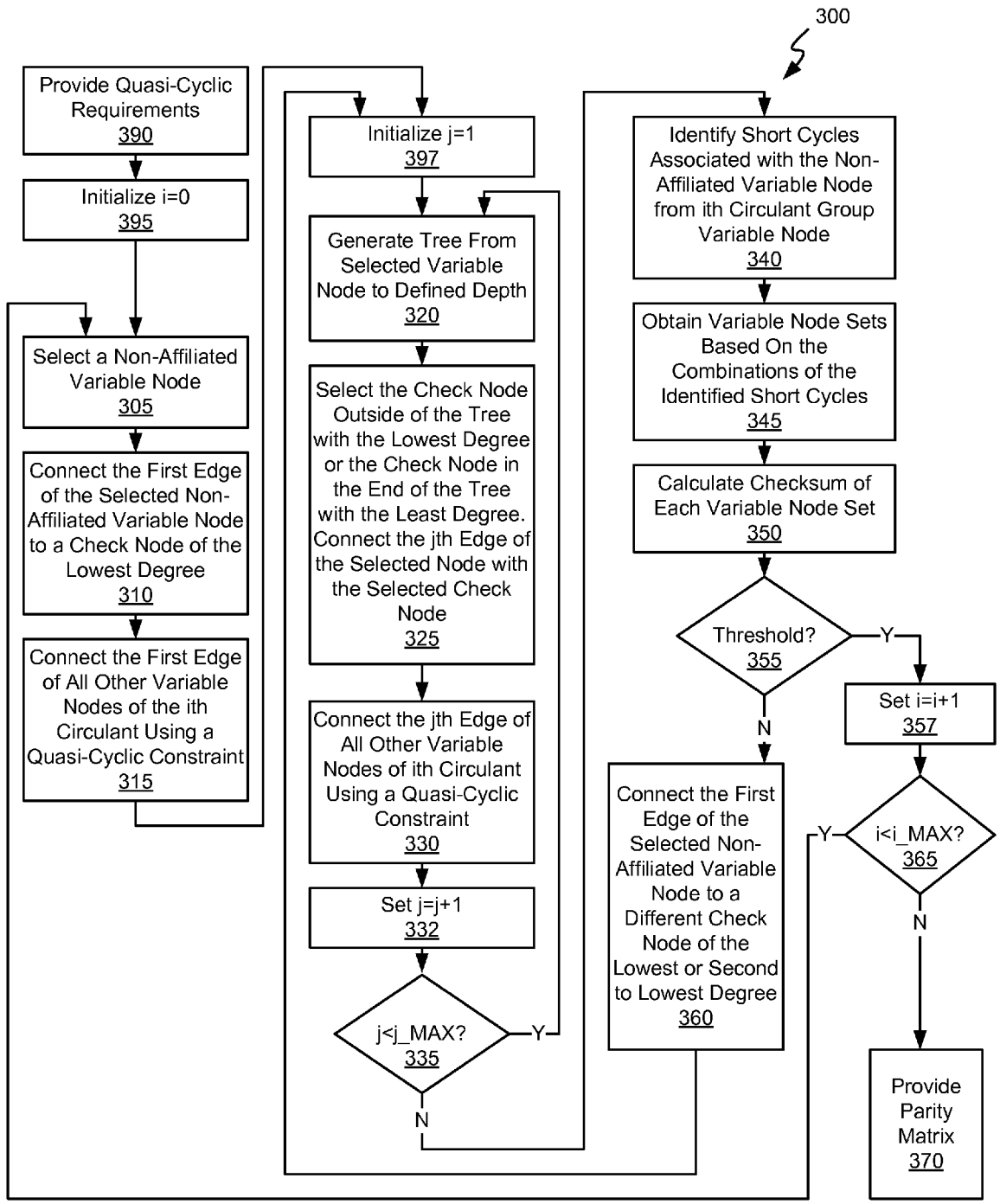
FIG. 3 is a flow diagram depicting a method in accordance with some embodiments of the present invention for quasi cyclic parity matrix construction.

The present inventions are related to systems and methods for data processing, and more particularly to LDPC based data processing.

Turning to FIG. 1, a storage system 100 including read channel circuit 110 that includes quasi-cyclic encoding/decoding and trapping set mitigation in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

As is well known in the art, a trapping set is a set of data nodes in a Tanner graph that cannot always be decoded to an original value regardless of the number iterations performed. Such sets of nodes are stable solutions to a low density parity check code (LDPC) decoding that often manifest in a cluster of interconnected nodes, such that the influence from outside these nodes is limited. Said another way, the nodes are insufficiently connected to other nodes in the graph such that a decoding failure results. During the decoding process, it is possible to get stuck in a trapping set which is not sufficiently connected to other nodes resulting in a failure in decoding.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

Turning to FIG. 2, a data processing system 200 relying on quasi-cyclic decoding is shown in accordance with various embodiments of the present invention. Data processing system 200 includes an encoding circuit 220 that applies a parity check matrix to an original input 205. Original input 205 may be any set of input data. For example, where data processing system 200 is a hard disk drive, original input 205 may be a data set that is destined for storage on a storage medium. In such cases, a medium 240 of data processing system 200 is a storage medium. As another example, where data processing system 200 is a communication system, original input 205 may be a data set that is destined to be transferred to a receiver via a transfer medium. Such transfer mediums may be, but are not limited to, wired or wireless transfer mediums. In such cases, a medium 240 of data processing system 200 is a transfer medium. The parity check matrix is received from a block 210 that generates a quasi-cyclic parity check matrix based upon various input constraints. Generation of the parity check matrix is discussed below in relation to FIGS. 3-5. The encoding applied by encoding circuit 220 is low density parity check encoding constrained by the generated parity check matrix as is known in the art constrained by the generated parity check matrix.

Encoding circuit 220 provides a codeword (i.e., original input encoded using the parity check matrix) 225 to a transmission circuit 230. Transmission circuit 230 may be any circuit known in the art that is capable of transferring the received codeword 225 via medium 240. Thus, for example, where data processing circuit 200 is part of a hard disk drive, transmission circuit 230 may include a read/write head assembly that converts an electrical signal into a series of magnetic signals appropriate for writing to a storage medium. Alternatively, where data processing circuit 200 is part of a wireless communication system, transmission circuit 230 may include a wireless transmitter that converts an electrical signal into a radio frequency signal appropriate for transmission via a wireless transmission medium. Transmission circuit 230 provides a transmission output 235 to medium 240. Medium 240 provides a transmitted input 245 that is transmission output 235 augmented with one or more errors introduced by the transference across medium 240.

Data processing circuit 200 includes a pre-processing circuit 250 that applies one or more analog functions to transmitted input 245. Such analog functions may include, but are not limited to, amplification and filtering. Based upon the disclosure provided herein, one of ordinary skill in the art will recognize a variety of pre-processing circuitry that may be used in relation to different embodiments of the present invention. Pre-processing circuit 250 provides a pre-processed output 255 to a decoding circuit 260. Decoding circuit 260 includes a low density parity check decoder that is capable of decoding the encoded data incorporating the generated parity check matrix. Decoding circuit 260 provides a data output 265. Of note, the parity check matrix used in encoding circuit 220 is often referred to as the generation matrix or G-matrix, and is the inverse of the parity check matrix used in decoding circuit 260 that is often referred to as the H-matrix. Both the H-matrix and G-matrix are pre-constructed using the processes described below in relation to FIGS. 3-5.

Turning to FIG. 3, a flow diagram 300 depicts a method in accordance with some embodiments of the present invention for quasi cyclic parity matrix construction. Following flow diagram 300, a set of quasi-cyclic requirements are provided (block 390). Such quasi-cyclic requirements include identifying the number of variable nodes and check nodes to be utilized in a generated parity matrix. In addition, the variable degree, the check degree and the circulant size are indicated. The circulant size corresponds to the size of sub-matrices within the generated parity matrix that will be used. As an example, twenty-four variable nodes, sixteen check nodes, a variable degree of two, a check degree of three, and a 4×4 circulant size may be requested. Where a 4×4 circulant size is requested and the overall matrix is 24×16 (i.e., the number of variable nodes by the number of check nodes), twenty-four total circulants are included. In some embodiments of the present invention, the processes of flow diagram 300 are implemented with machine executable instructions. The machine executable instructions may be maintained on a computer readable medium that is accessible by a computer processor. The computer processor is capable of accessing the machine executable instructions from the computer readable medium, and executing the machine executable instructions to yield the generated parity check matrix. The generated parity matrix (both a G-matrix and an H-matrix) may then be provided to a data processing system where it is used in relation to both data encoding and data decoding.

A circulant index counter, i, is initialized to zero (block 395). The first variable node of the ith circulant group that has not been previously affiliated with one or more check nodes is selected (block 305). A first edge of the selected, non-affiliated variable node is connected with a check node of the lowest degree (block 310). The check node of the lowest degree is one of the check nodes that has been affiliated with the fewest number of variable nodes. Thus, on the first pass, any of the check nodes may be selected. As the process continues, fewer and fewer of the available check nodes are capable of satisfying the lowest degree requirement. Once the selected, non-affiliated variable node is connected, the other variable nodes associated with the ith circulant group are also connected in accordance with a quasi-cyclic constraint (block 315). As an example, where a 3×3 circulant is used and the 1,1 position is used to connect the selected, non-affiliated variable node, the following quasi-cyclic constraint is used:

$$\begin{bmatrix} 001 \\ 010 \\ 001 \end{bmatrix}.$$

As another example, where the same 3×3 circulant is used and the 2,1 position is used to connect the selected, non-affiliated variable node, the following quasi-cyclic constraint is used:

$$\begin{bmatrix} 001 \\ 100 \\ 010 \end{bmatrix}.$$

As yet another example, where the same 3×3 circulant is used and the 2,3 position is used to connect the selected, non-affiliated variable node, the following quasi-cyclic constraint is used:

$$\begin{bmatrix} 010 \\ 001 \\ 100 \end{bmatrix}.$$

As will be noted by one of ordinary skill in the art, where the first connection is identified, the connections of the other variable nodes in the same circulant group become deterministic. In particular, where the connection in row one is in a position x, the connection in row two will be in a position x+1. Where position x+1 is greater than the number of columns, then the connection is made in the first column. It should be noted that circulants of a size other than 3×3 may be used in accordance with different embodiments of the present invention.

An edge index counter, j, is initialized to be equal to one (block 397). A tree from the selected, non-affiliated variable node is created to determine another check node to which the variable node is to be connected (block 320). The tree is built by identifying all of the connections to the selected, non-affiliated variable node. Selection of another check node is done by selecting one of the check nodes that is not included in the tree or the check node in the top of the tree with the lowest degree if there is no check node that is not included in the tree (i.e., no check node outside of the tree) (block 325). Once the selected, non-affiliated variable node is connected, the other variable nodes associated with the ith circulant are also connected in accordance with a quasi-cyclic constraint (block 330).

The edge index counter is incremented (block 332). It is then determined whether there are edges that remain to be connected by comparing the value of the edge index counter with a maximum count value (block 335). Where additional edges remain to be connected (block 335), the processes of blocks 320-335 are repeated for the next selected variable node. Alternatively, where no edges remain to be connected (block 335), an attempt to reduce any trapping sets is performed. In particular, short cycles associated with each check node are identified (block 340). The variable node sets associated with each of the identified short cycles are obtained (block 345), and check sums for each of the variable node sets are calculated (block 350). The checksums and the number of the variable nodes in the variable node sets are compared to a threshold value (block 355). Where the checksum and the number of the variable nodes are below the threshold value (block 355), trapping set mitigation is performed by trying a different connection (block 360). Such trapping set mitigation may include, for example, re-processing one or more connections using the processes discussed above in relation to blocks 320-335. Otherwise, when the checksum and the number of the variable nodes does not exceed the threshold value (block 355), the circulant index counter is incremented (block 357). It is then determined whether there are circulants that remain to be connected by comparing the circulant index counter value with a known maximum number of circulants (block 365). If all circulants are connected (i.e., i=i_MAX), the parity matrix is provided (block 370) for use in relation to the low density parity check decoding and encoding. Alternatively, where circulants remain to eb connected (i.e., i<i_MAX), blocks 305-355 are repeated for the variable nodes in the ith circulant.

Figure 4C:
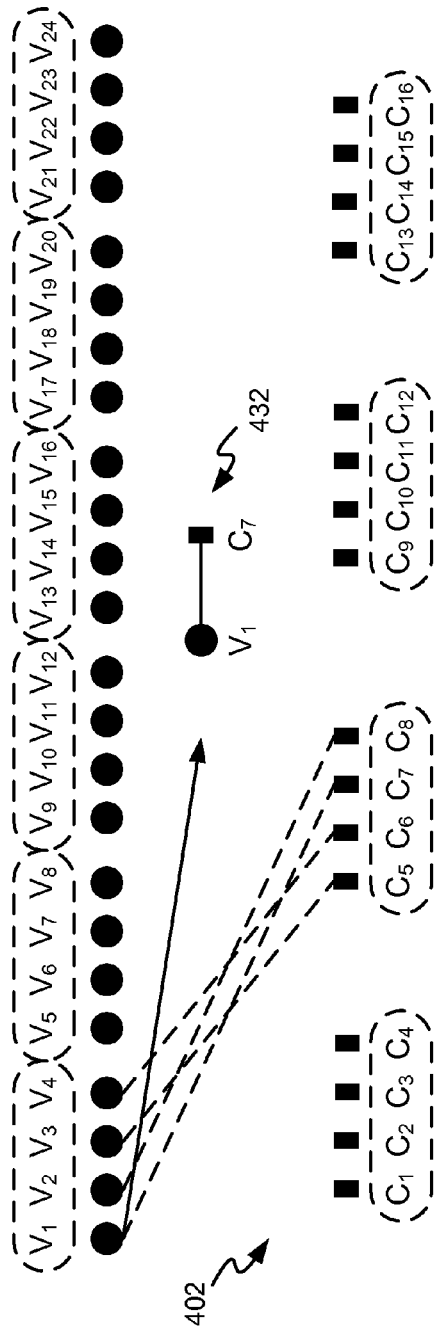
FIGS. 4a-4t show a process for quasi cyclic parity matrix construction in accordance with one or more embodiments of the present invention.
Figure 4D:
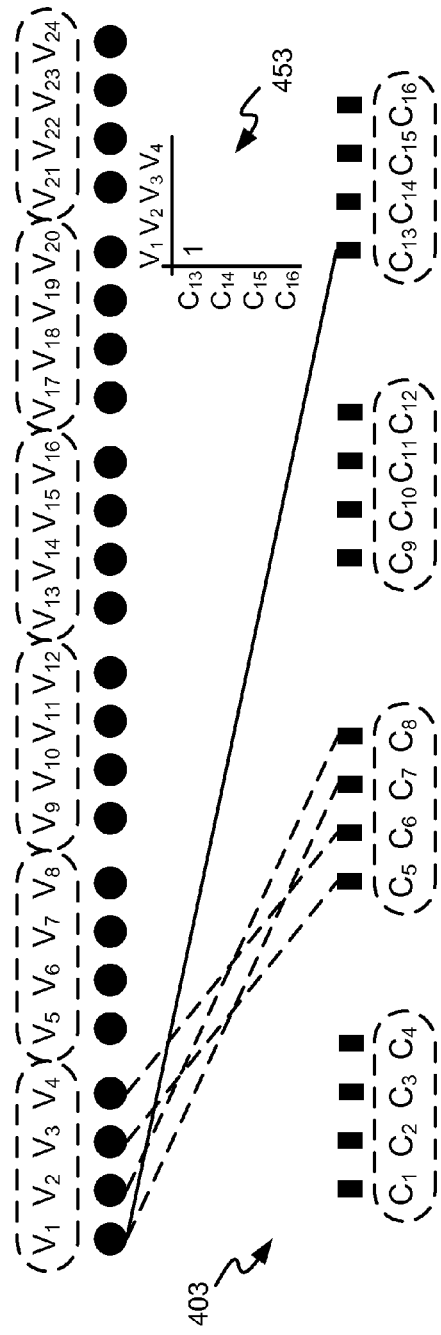
Figure 4E:
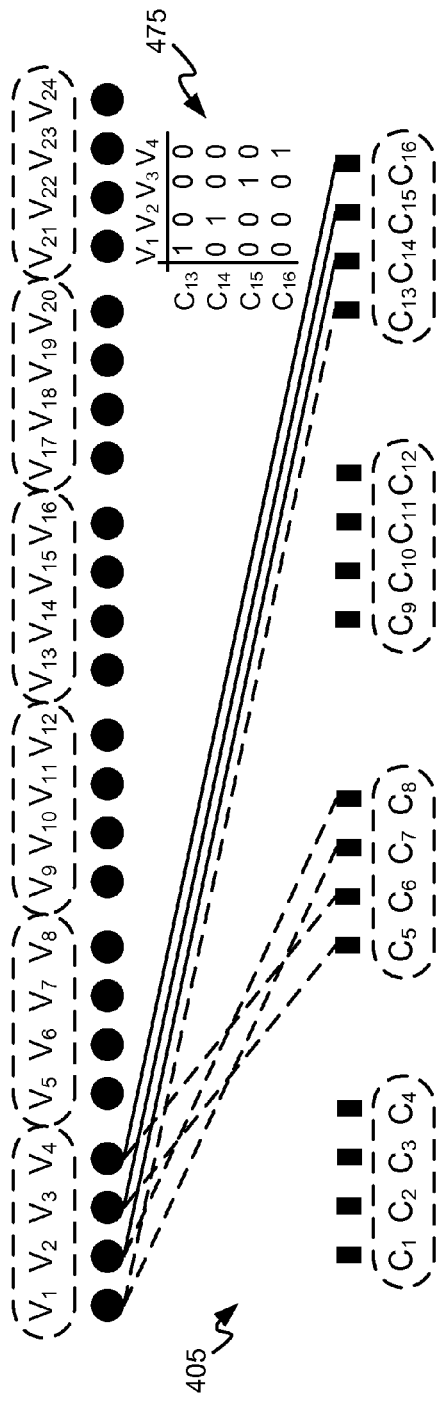
Figure 4F:
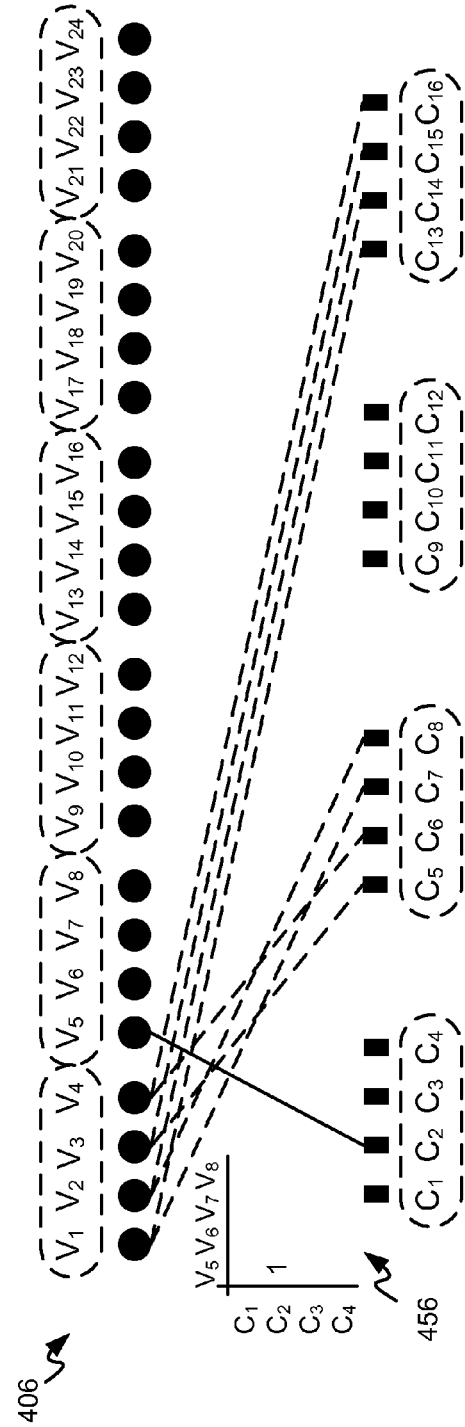
Figure 4I:
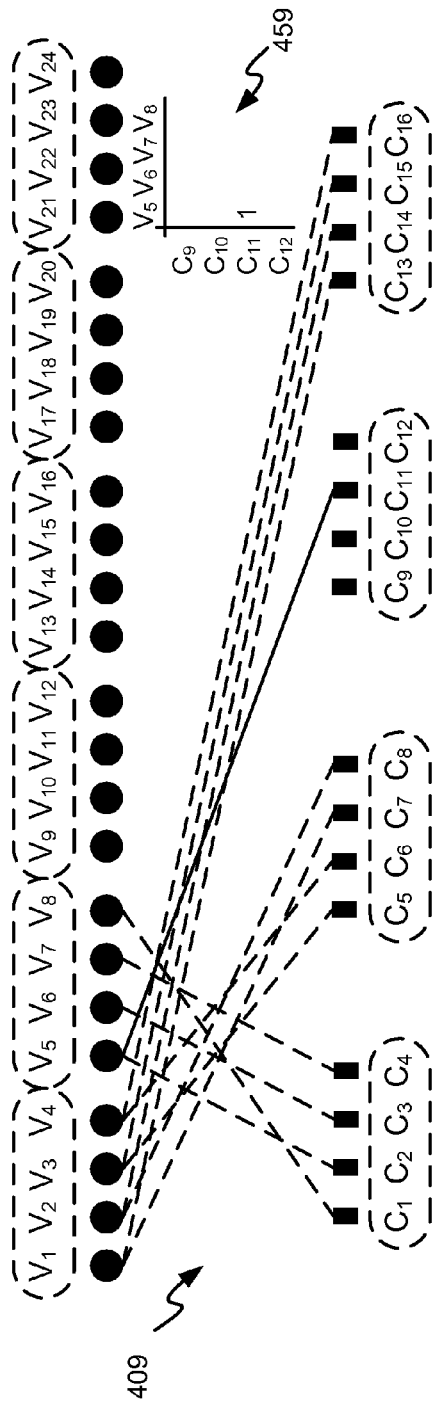
Figure 4J:
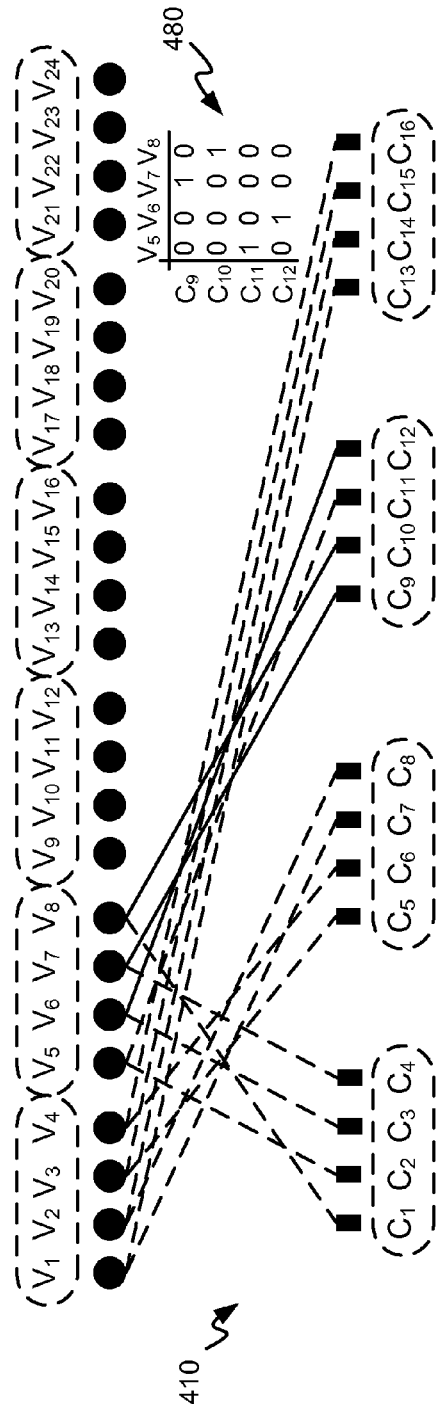
Figure 4O:
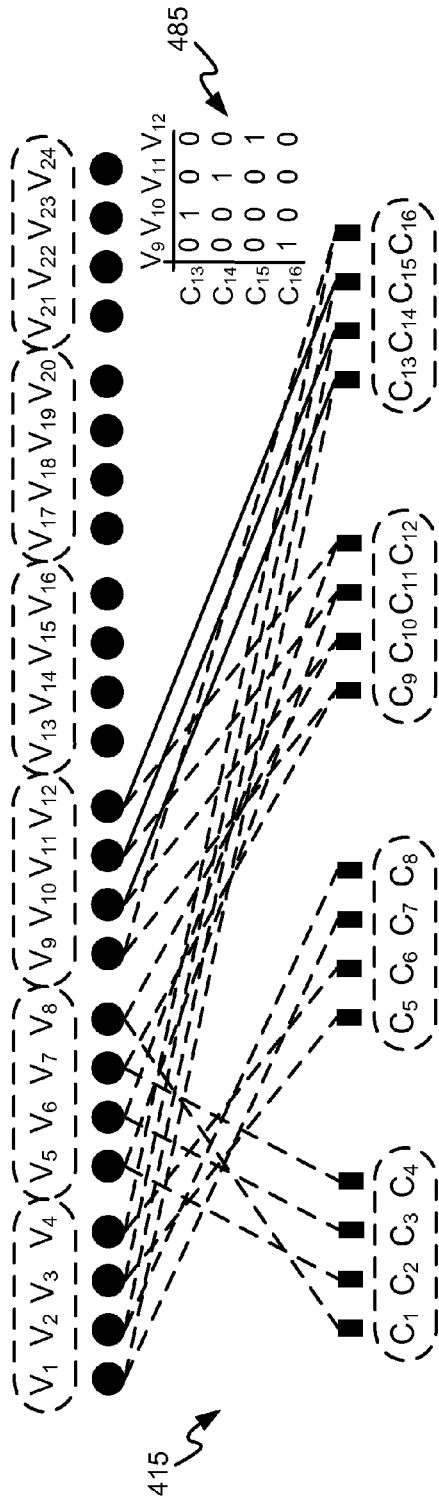
Figure 4P:
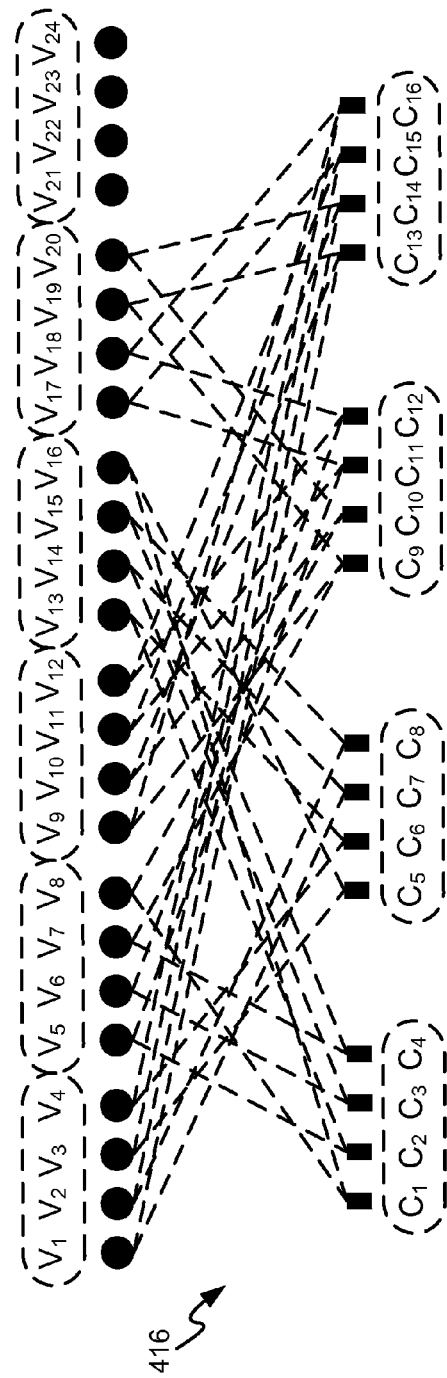
Figure 4Q:
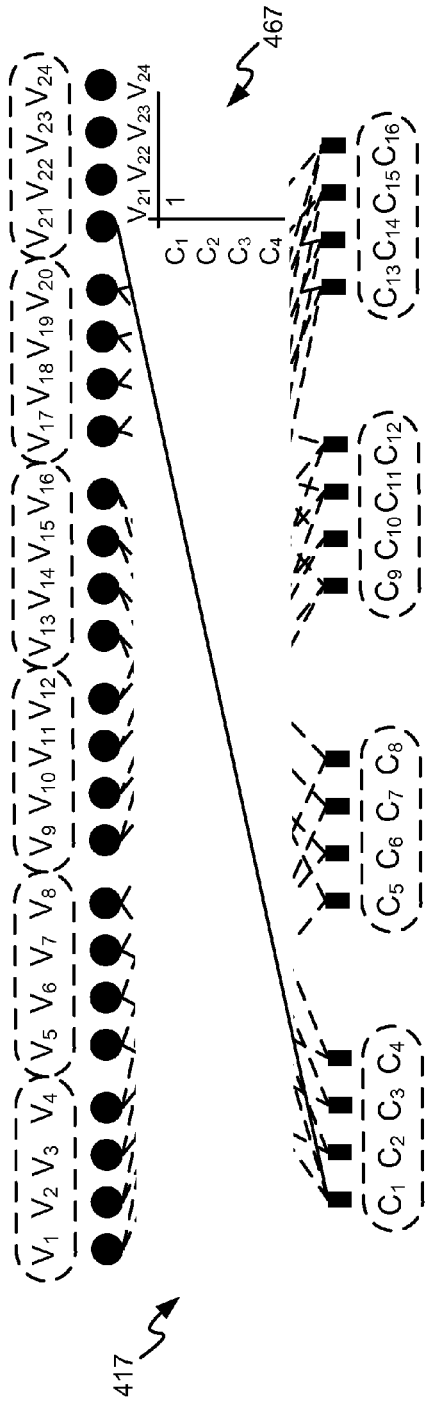
Figure 4R:
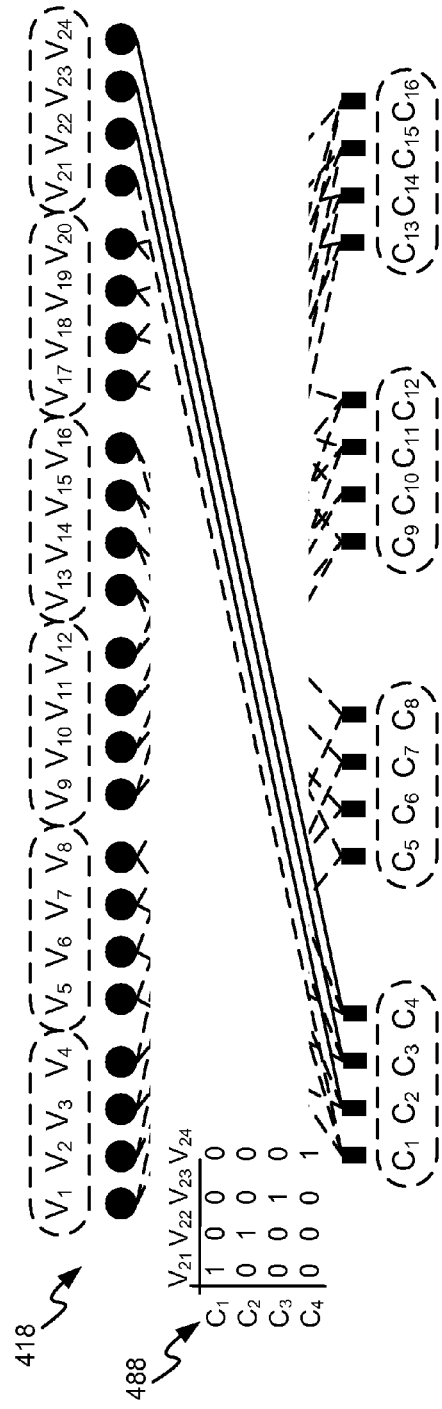
Figure 4S:
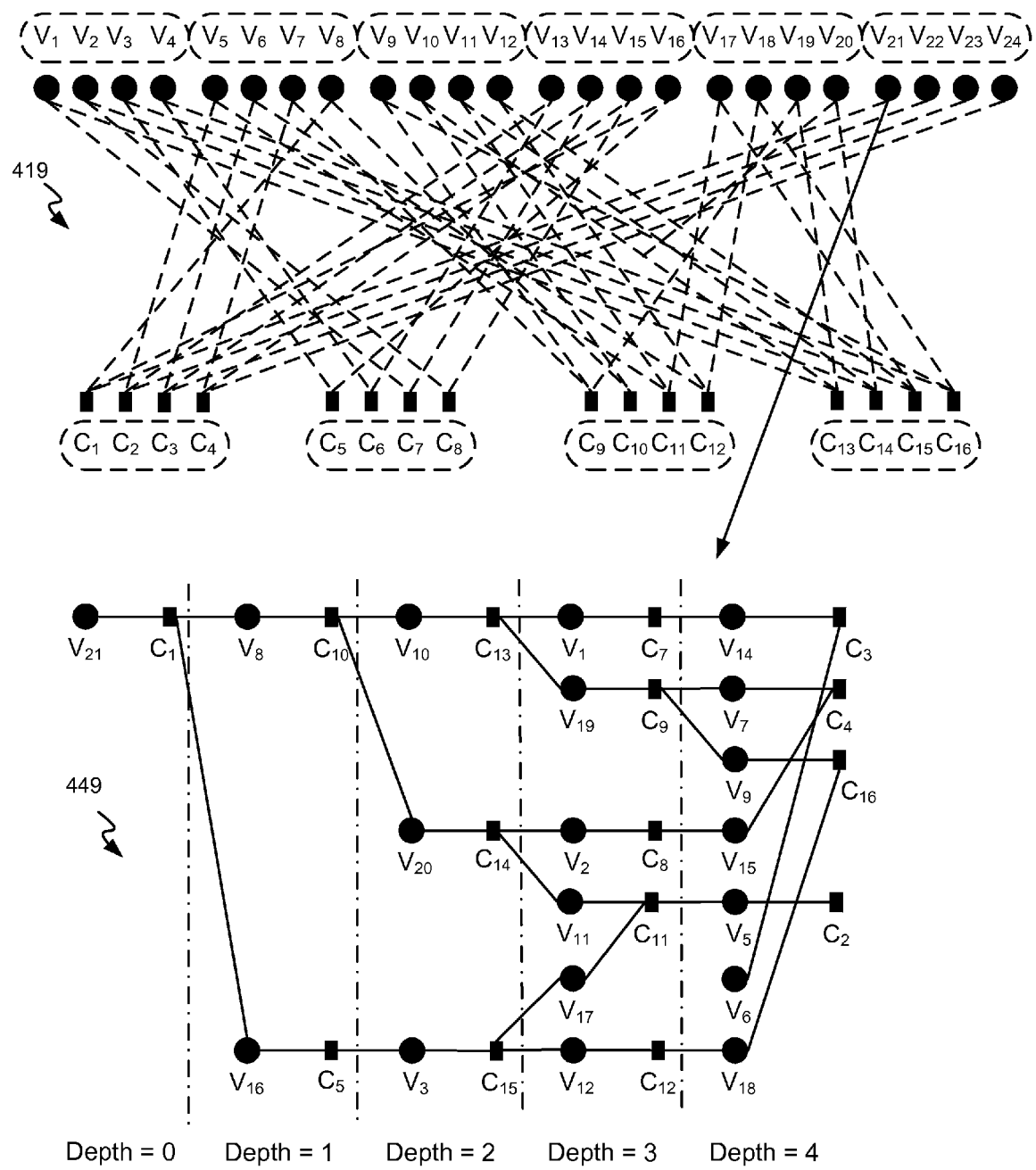
Figure 4T:
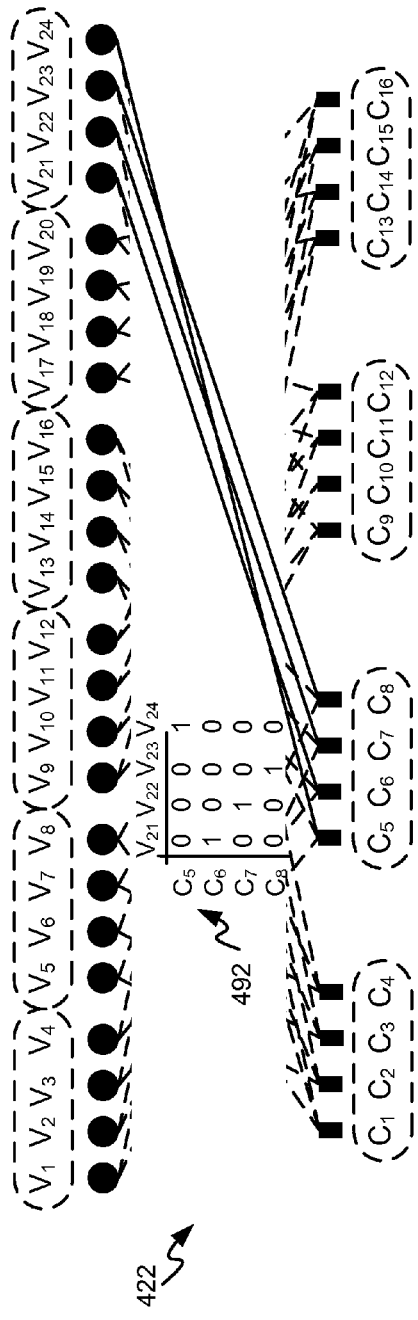

Turning to FIGS. 4*a*-4*t* an example of the processes of blocks 305-335 are performed in accordance with one or more embodiments of the present invention. The processes set forth in FIGS. 4*a*-4*u* are based upon a circulant size of 4×4, twenty-four variable nodes, sixteen check nodes, a variable degree of two, and a check degree of three. Based upon the disclosure provided herein, one of ordinary skill in the art will recognize a variety of other parameters that may be used in relation to different embodiments of the present invention. FIG. 4*a* is a Tanner graph 400 showing the process of block 305 and block 310 where variable node $V_1$ is selected, and a connection node with the lowest degree is selected for connection to variable node $V_1$. As shown, all of the connection nodes (i.e., $C_1$-$C_{16}$) are connected to the same number of variable nodes, and thus all have the same degree. In this case, connection node $C_7$ is selected. A partially filled matrix 450 shows the connection between $V_1$ and $C_7$ with a '1' in the connection location.

Next, turning to FIG. 4b, a Tanner graph 401 depicts the processes of block 315. In this case, matrix 450 is filled in to include the remaining connections by shifting the connection in row $C_7$ right to make row $C_8$, row $C_8$ is shifted right to make row $C_5$, and row $C_5$ is shifted right to make row $C_6$, This shifting results in a quasi-cyclic constraint 471. The connection of Tanner graph 400 are shown as a dashed line, and the other connections corresponding to quasi-cyclic constraint 471. The connection of Tanner graph 400 is shown as a dashed line, and the other connections corresponding to quasi-cyclic constraint 471 are shown as solid lines.

Next, turning to FIG. 4c, a Tanner graph 402 depicts the processes of block 320. In particular, a tree 432 is generated to determine another connection that is to be performed on variable node $V_1$. Tree 432 is generated by following all of the connections to variable node $V_1$. In this case, the only node that is connected to variable node $V_1$ is check node $C_7$. Thus, any check node other than $C_7$ may be used as the additional connection for variable node $V_1$. As shown in a Tanner graph 403 of FIG. 4d, check node $C_{13}$ is selected. A partially filled matrix 453 shows the connection between $V_1$ and $C_{13}$ with a '1' in the connection location. The connections of Tanner graph 401 are shown as dashed lines, and the other connection corresponding to partially filled matrix 453 is shown as a solid line.

Next, turning to a Tanner graph 405 of FIG. 4e, the processes of block 325 are shown including filling in matrix 453 to include the remaining connections by shifting the connection in row $C_{13}$ right to make row $C_{14}$, row $C_{14}$ is shifted right to make row $C_{15}$, and row $C_{16}$ is shifted right to make row $C_{16}$. This shifting results in a quasi-cyclic constraint 475, and Tanner graph 405 is updated to reflect connections in accordance with quasi-cyclic constraint 475. The connections of Tanner graph 403 are shown as dashed lines, and the other connections corresponding to quasi-cyclic constraint 475 are shown as solid lines.

Other variable nodes remain to be connected (i.e., other edges remain to be connected (block 330)). Accordingly, the aforementioned processes are repeated for the remaining nodes. Turning to FIG. 4f, a Tanner graph 406 shows the process of block 305 and block 310 where variable node $V_5$ is selected, and a connection node with the lowest degree is selected for connection to variable node $V_5$. As shown, any of connection nodes $C_1$-$C_4$ and $C_9$-$C_{16}$ are connected to the same number of variable nodes, and thus all have the same degree. In this case, connection node $C_2$ is selected for connection to variable node $V_5$. A partially filled matrix 456 shows the connection between $V_5$ and $C_2$ with a '1' in the connection location. The connections of Tanner graph 405 are shown as dashed lines, and the connection of $V_5$ and $C_2$ is shown as a solid line.

Next, turning to FIG. 4g, a Tanner graph 407 depicts the processes of block 315. In this case, matrix 456 is filled in to include the remaining connections by shifting the connection in row $C_2$ right to make row $C_3$, row $C_3$ is shifted right to make row $C_4$, and row $C_4$ is shifted right to make row $C_1$ This shifting results in a quasi-cyclic constraint 477. The connections of Tanner graph 406 are shown as dashed lines, and the connection of other connections corresponding to quasi-cyclic constraint 477 are shown as solid lines.

Next, turning to FIG. 4h, a Tanner graph 408 depicts the processes of block 320. In particular, a tree 438 is generated to determine another connection that is to be performed on variable node $V_5$. Tree 438 is generated by following all of the connections to variable node $V_5$. In this case, the only node that is connected to variable node $V_5$ is check node $C_2$. Thus, any check node other than $C_2$ may be used as the additional connection for variable node $V_5$. As shown in a Tanner graph 408 of FIG. 4i, check node $C_{11}$ is selected. A partially filled matrix 459 shows the connection between $V_5$ and $C_{11}$ with a '1' in the connection location. The connections of Tanner graph 408 are shown as dashed lines, and the other connection corresponding to partially filled matrix 459 is shown as a solid line.

Next, turning to a Tanner graph 410 of FIG. 4j, the processes of block 325 are shown including filling in matrix 459 to include the remaining connections by shifting the connection in row $C_{11}$ right to make row $C_{12}$, row $C_{12}$ is shifted right to make row $C_9$, and row $C_9$ is shifted right to make row $C_{10}$. This shifting results in a quasi-cyclic constraint 480, and Tanner graph 410 is updated to reflect connections in accordance with quasi-cyclic constraint 480. The connections of Tanner graph 409 are shown as dashed lines, and the other connections corresponding to quasi-cyclic constraint 480 are shown as solid lines.

Other variable nodes remain to be connected (i.e., other edges remain to be connected (block 330)). Accordingly, the aforementioned processes are repeated for the remaining nodes. Turning to FIG. 4k, a Tanner graph 411 shows the process of block 305 and block 310 where variable node $V_9$ is selected, and a connection node with the lowest degree is selected for connection to variable node $V_9$. As shown, all connection nodes (i.e., $C_1$-$C_{16}$) are connected to the same number of variable nodes (i.e., one), and thus all have the same degree. In this case, connection node $C_9$ is selected for connection to variable node $V_9$. A partially filled matrix 461 shows the connection between $V_9$ and $C_9$ with a '1' in the connection location. The connections of Tanner graph 410 are shown as dashed lines, and the connection of $V_9$ and $C_9$ is shown as a solid line.

Next, turning to FIG. 4l, a Tanner graph 412 depicts the processes of block 315. In this case, matrix 461 is filled in to include the remaining connections by shifting the connection in row $C_9$ right to make row $C_{10}$, row $C_{10}$ is shifted right to make row $C_{11}$, and row $C_{11}$ is shifted right to make row $C_{12}$. This shifting results in a quasi-cyclic constraint 482. The connections of Tanner graph 411 are shown as dashed lines, and the connection of other connections corresponding to quasi-cyclic constraint 482 are shown as solid lines.

Next, turning to FIG. 4m, a Tanner graph 413 depicts the processes of block 320. In particular, a tree 443 is generated to determine another connection that is to be performed on variable node $V_9$. Tree 443 is generated by following all of the connections to variable node $V_9$. In this case, the only nodes that are connected to variable node $V_9$ are check node $C_9$, variable node $V_7$, and check node $C_4$. Thus, any check node other than $C_9$ or $C_4$ may be used as the additional connection for variable node $V_5$. As shown in a Tanner graph 414 of FIG. 4n, check node $C_{16}$ is selected. A partially filled matrix 464 shows the connection between $V_9$ and $C_{16}$ with a '1' in the connection location. The connections of Tanner graph 413 are shown as dashed lines, and the other connection corresponding to partially filled matrix 464 is shown as a solid line.

Next, turning to a Tanner graph 415 of FIG. 4o, the processes of block 325 are shown including filling in matrix 464 to include the remaining connections by shifting the connection in row $C_{16}$ right to make row $C_{13}$, row $C_{13}$ is shifted right to make row $C_{14}$, and row $C_{14}$ is shifted right to make row $C_{15}$. This shifting results in a quasi-cyclic constraint 485, and Tanner graph 415 is updated to reflect connections in accordance with quasi-cyclic constraint 485. The connections of Tanner graph 414 are shown as dashed lines, and the other connections corresponding to quasi-cyclic constraint 485 are shown as solid lines.

Other variable nodes remain to be connected (i.e., other edges remain to be connected (block 330)), so the processes of blocks 305-335 are further repeated to complete the graph. A Tanner graph 416 is shown in FIG. 4p where the processes of blocks 305-325 have been repeated to complete the connection of all variable nodes, except variable nodes $V_{21}$-$V_{24}$. Turning to FIG. 4q, a Tanner graph 417 is shown with the center area of the graph whited out to allow the newly added connections to be more easily seen. In this case, the processes of blocks 305-310 are repeated where the previously non-affiliated variable node $V_{21}$ is selected. A connection node with the lowest degree is selected for connection to variable node $V_{21}$. As shown, any of connection nodes $C_1$-$C_4$ and $C_5$-$C_8$ are connected to the same number of variable nodes, and thus all have the same degree. In this case, connection node $C_1$ is selected for connection to variable node $V_{21}$. A partially filled matrix 467 shows the connection between $V_{21}$ and $C_1$ with a '1' in the connection location.

Next, turning to FIG. 4r, a Tanner graph 418 depicts the processes of block 315. In this case, matrix 467 is filled in to include the remaining connections by shifting the connection in row $C_1$ right to make row $C_2$, row $C_2$ is shifted right to make row $C_3$, and row $C_3$ is shifted right to make row $C_4$ This shifting results in a quasi-cyclic constraint 488. The connections of Tanner graph 417 are shown as dashed lines, and the connection of other connections corresponding to quasi-cyclic constraint 488 are shown as solid lines.

Next, turning to FIG. 4s, a Tanner graph 419 depicts the processes of block 320. In particular, a tree 449 is generated to determine another connection that is to be performed on variable node $V_{21}$. Tree 449 is generated by following all of the connections to variable node $V_{21}$. In this case, the only node that is not connected to variable node $V_{21}$ is check node $C_6$. Thus, only check node $C_6$ can be used as the additional connection for variable node $V_{21}$. As shown in a Tanner graph 419 of FIG. 4s, check node $C_6$ is selected. Next, turning to a Tanner graph 422 of FIG. 4t, the processes of block 325 are shown resulting in a quasi-cyclic constraint 492, and Tanner graph 422 is updated to reflect connections in accordance with quasi-cyclic constraint 492. The result of the connected Tanner graph is provided as a parity check matrix that may be used for LDPC decoding and encoding.

Figure 5A:
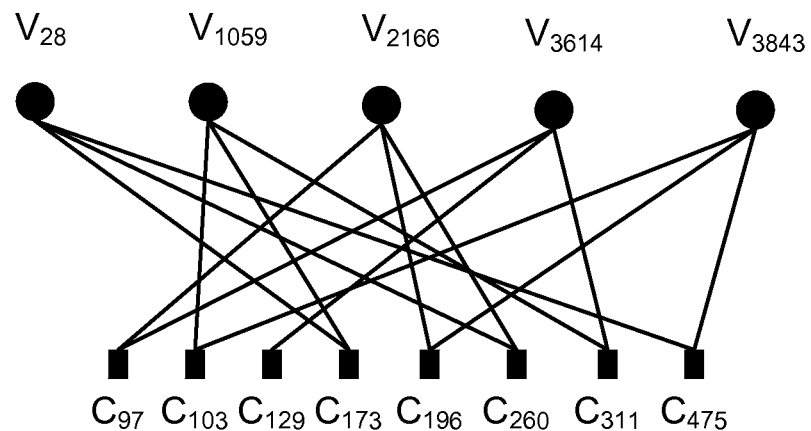
FIGS. 5a-5b show a process for trapping set mitigation in accordance with some embodiments of the present invention.
Figure 5B:
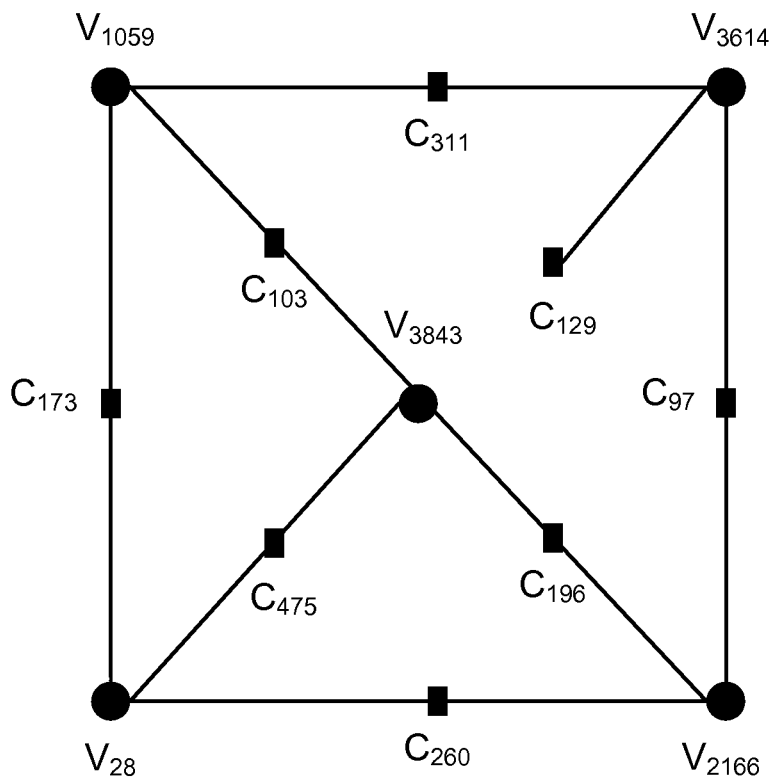

Turning to FIGS. 5a-5b an example of the processes of blocks 340-360 are performed in accordance with one or more embodiments of the present invention. Turning to FIG. 5a, an example set of connections from a portion 500 of a Tanner graph are depicted. In FIG. 5b, portion 510 is redrawn to show a number of short cycles within the Tanner graph. In some cases, a short cycle is defined as a cycle including six connections or fewer. In other cases, a short cycle is defined as including eight connections or fewer. In particular, by parsing the connections of the graphs, the following short cycles are identified (block 335):

(A) the cycle of $V_{28}$-$C_{173}$-$V_{1059}$-$C_{103}$-$V_{3843}$-$C_{475}$, that includes five connections;

(B) the cycle of $V_{28}$-$C_{173}$-$V_{1059}$-$C_{311}$-$V_{3614}$-$C_{97}$-$V_{2166}$-$C_{260}$, that includes seven connections;

(C) the cycle of $V_{28}$-$C_{173}$-$V_{1059}$-$C_{103}$-$V_{3843}$-$C_{196}$-$V_{2166}$-$C_{260}$, that includes seven connections; and (D) the cycle of $V_{1059}$-$C_{103}$-$V_{3843}$-$C_{196}$-$V_{2166}$-$C_{97}$-$V_{3614}$-$C_{311}$, that includes seven connections.

A combination of any two of the aforementioned short cycles may comprise a trapping set. The variable node sets for each of the short cycles are identified as follows (block 340):

(A) node set $\{\{V_{28}, V_{1059}, V_{3843}\}\}$;
(B) node set $\{\{V_{28}, V_{1059}, V_{3614}, V_{2166}\}\}$;
(C) node set $\{\{V_{28}, V_{1059}, V_{3843}, V_{2166}\}\}$; and
(D) node set $\{\{V_{1059}, V_{3843}, V_{2166}, V_{3614}\}\}$.

A checksum for each of the aforementioned node sets is then calculated (block 345). These checksums are then compared with a programmable threshold value (block 350). Where the threshold is not met, mitigation of the trapping set is performed. This mitigation is done by re-performing one or more of the connections discussed above in relation to FIGS. 4a-4t. In particular, when connection of a variable node allows for selection of more than one check node, a check node that increases the number of connections and/or increases the checksum is selected. In this way, some dominant trapping sets may be avoided.

The aforementioned approach for trapping set optimization may be used to mitigate the effects of trapping sets by avoiding some of the more problematic trapping sets. Such an approach works very efficiently for low column weight low density parity check codes (i.e., codes with a column weight less than or equal to four). In some cases, code design using the aforementioned trapping set mitigation may be done without increases to hardware decoders or encoders, and yet produce a reduction in the error floor. This is particularly true where irregular low density parity check codes are used.

Figure 6:
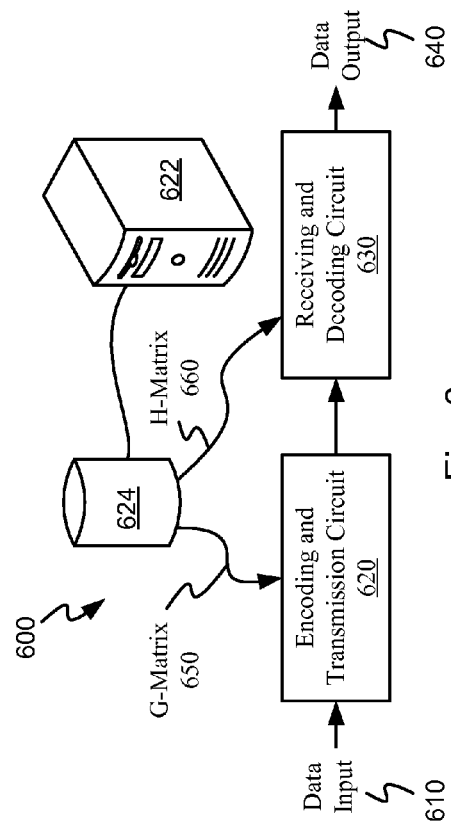
FIG. 6 depicts a data processing system in accordance with various embodiments of the present invention.

Turning to FIG. 6, a data processing system 600 is shown in accordance with various embodiments of the present invention. Data processing system 600 includes a processor 622 that is communicably coupled to a computer readable medium 624. As used herein, the phrase "computer readable" medium is used in its broadest sense to mean any medium or media capable of holding information in such a way that it is accessible by a computer processor. Thus, a computer readable medium may be, but is not limited to, a magnetic disk drive, an optical disk drive, a random access memory, a read only memory, an electrically erasable read only memory, a flash memory, or the like. Based upon the disclosure provided herein, one of ordinary skill in the art will recognize a variety of computer readable mediums and/or combinations thereof that may be used in relation to different embodiments of the present invention. Computer readable medium 624 includes instructions executed by processor 622 to produce a G-matrix 650 and a corresponding H-matrix 660 in accordance with the approach discussed above in relation to FIG. 3 and FIGS. 4. G-matrix 650 is provided to an encoding and transmission circuit 620 that encodes a data input 610 using G-matrix 610 to produce a codeword. H-matrix 660 is provided to a receiving and decoding circuit 630 that decodes the codeword using H-matrix 660 to provide a data output 640.

The systems, circuits and methods discussed above in relation to FIGS. 1-6 relate to processes for encoding and decoding using matrices such that trapping sets are mitigated. FIGS. 7-11 relate to processes for developing matrices that reduce trapping sets. As an example, the processes and systems of FIGS. 7-11 may be used to implement the functionality of block 210 of FIG. 2.

Turning to FIG. 7a, an LDPC code structure is shown that may be used in relation to one or more embodiments of the present invention. The depicted LDPC code structure includes an H matrix composed of an H1 matrix 700 and an H2 matrix 705. H1 matrix 700 is a low row weight code with regular columns. Each of the columns include a number of values ($P_{r,j}$). In some cases, the arrangement of the values ($P_{r,j}$) in H1 matrix 700 result in trapping sets. H2 matrix 705 is a high row weight matrix that is added to H1 matrix 700 to create an overall H matrix. The values $P_{r,j}$+$R_j$) of H2 matrix 705 are selected to eliminate or reduce the trapping sets of H1 matrix 700. Each of the values $R_j$ are of a matrix format 710 that includes a number of values q. Each of the values q are circulants of a matrix format 715. Turning to FIG. 7b, another LDPC code structure is shown that may be used in relation to some embodiments of the present invention. The depicted LDPC code structure includes an H matrix composed of an H1 matrix 750 and an H2 matrix 755. H1 matrix 750 is a low row weight code with irregular columns. Each of the columns include a number of values ($P_{r,j}$). In some cases, the arrangement of the values ($P_{r,j}$) in H1 matrix 750 result in trapping sets. H2 matrix 755 is a high row weight matrix that is added to H1 matrix 750 to create an overall H1 matrix. The values ($R_j$) of H2 matrix 755 are selected to eliminate or reduce the trapping sets of H1 matrix 750. Each of the values $R_j$ are of a matrix format 760 that includes a number of values q. Each of the values q are circulants of a matrix format 765.

Figure 8:
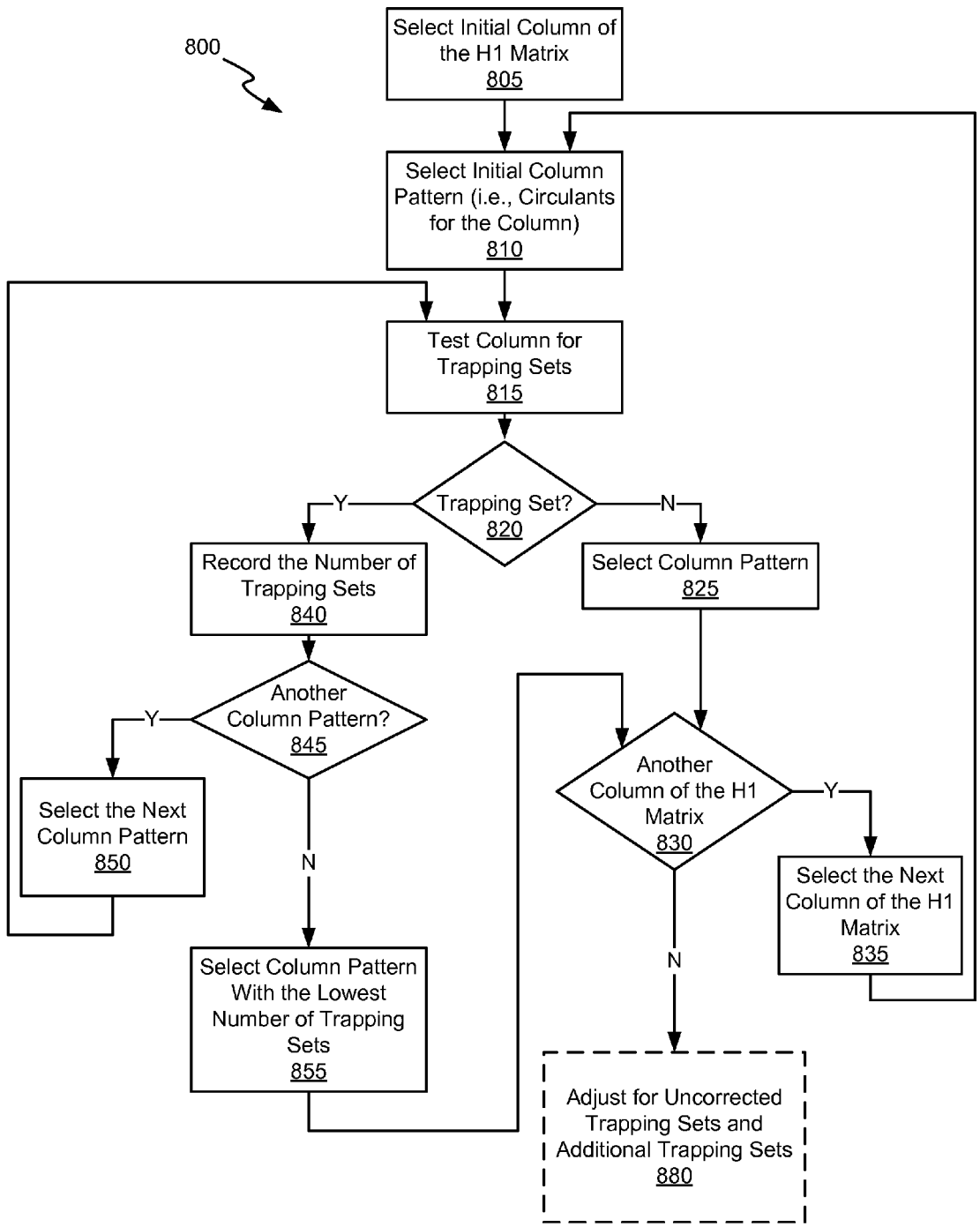
FIGS. 8-9 are flow diagrams showing a method in accordance with some embodiments of the present invention for generating an LDPC code.

Turning to FIG. 8, a flow diagram 800 shows a method in accordance with some embodiments of the present invention for generating an LDPC code. Following flow diagram 800, an initial column of an H1 matrix is selected (block 805). This may include, for example, selecting the first column of an H1 matrix. An initial pattern for the selected column is chosen (block 810). This includes selecting a circulant to be used for each of the values ($P_{r,j}$) in the selected column. The column is then processed to identify any potential trapping sets in the column (block 815). This column processing may be done using any trapping set detection methodology known in the art.

It is then determined whether any trapping sets were detected (block 820). Where no trapping sets are detected (block 820), the tested column pattern is selected for use in the H1 matrix (block 825). It is then determined if there is another column in the H1 matrix (block 830). Where there is another column of the H1 matrix (block 830), the next column of the H1 matrix is selected (block 835) and the processes of determining trapping sets for the next selected H1 matrix is performed. Alternatively, where no additional columns remain to be processed (block 830), the H2 matrix is generated to reduce or mitigate the effects of any trapping sets (block 880). An example of generating the H2 matrix is discussed below in relation to FIG. 9.

Alternatively, where one or more trapping sets are identified (block 820), the number of trapping sets is recorded in relation to the selected column pattern (block 840). It is then determined whether there is another pattern for the column (block 845). This includes selecting another circulant to be used for each of the values ($P_{r,j}$) in the selected column. Where there is another pattern to be tested (block 845), the next column pattern to be tested is selected (block 850). The processes for testing the trapping sets are then performed for the newly selected column pattern. Alternatively, where no additional column patterns remain to be tested (block 845), the column pattern that yielded the lowest number of trapping sets is selected (block 855). It is then determined whether there is another column of the H1 matrix (block 830), the next column of the H1 matrix is selected (block 835) and the processes of determining trapping sets for the next selected H1 matrix is performed. Alternatively, where no additional columns remain to be processed (block 830), the H2 matrix is generated to reduce or mitigate the effects of any trapping sets (block 880). Again, an example of generating the H2 matrix is discussed below in relation to FIG. 9.

Figure 9:
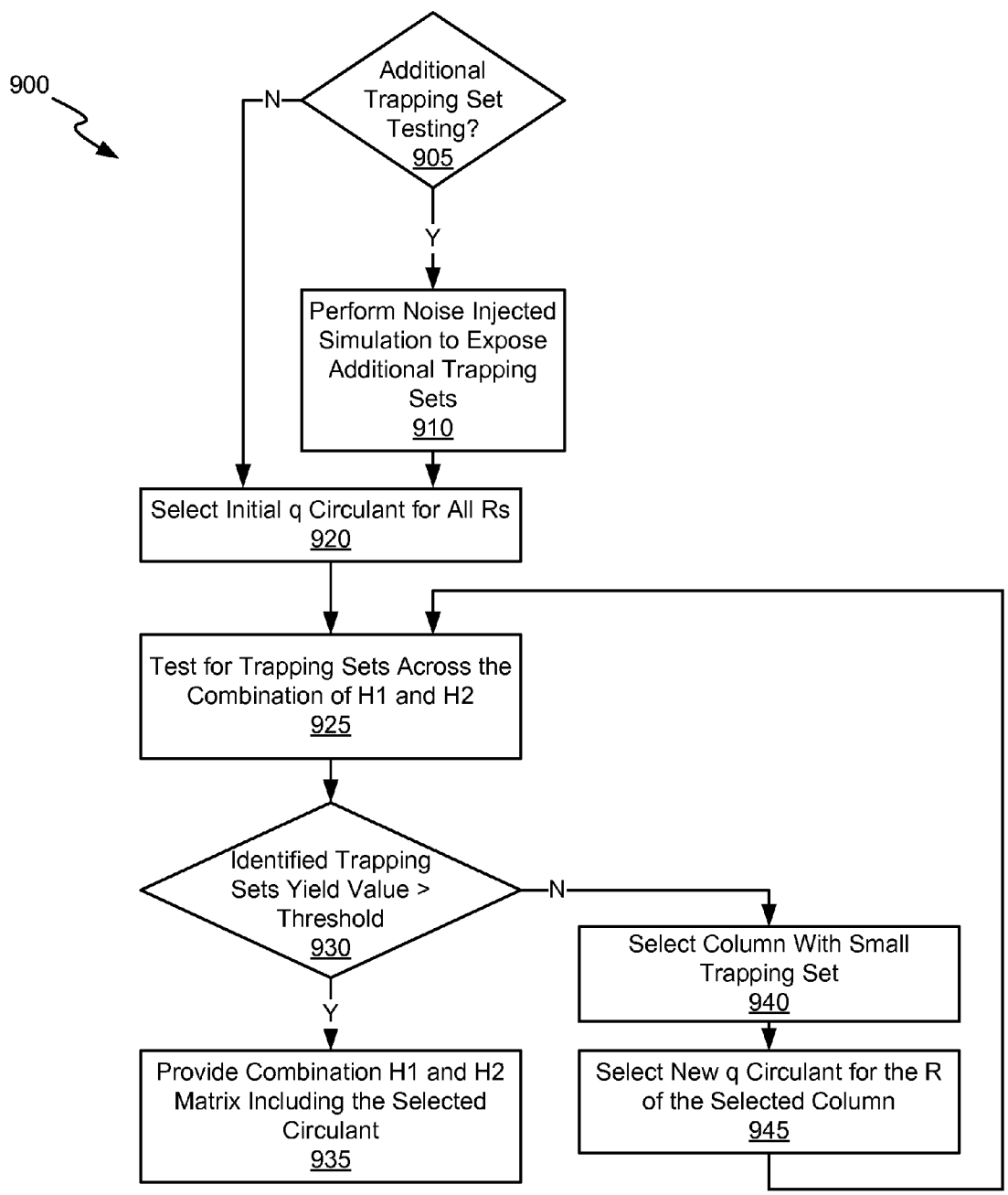

Turning to FIG. 9, a flow diagram 900 shows a method in accordance with some embodiments of the present invention for generating the H2 matrix of an LDPC code. Following flow diagram 900, it is determined whether additional trapping set testing is to be performed (block 905). Where additional trapping set testing is to be performed (block 905), a noise injected simulation is performed (block 910). Such a noise injected simulation includes processing the H1 matrix using a simulator where noise is added to the code built based on the H1 matrix. This processing may be done, for example, using the processes and systems discussed above in relation to FIGS. 1-6. Any trapping sets in addition to those previously identified in the flow diagram of FIG. 8, are added to those identified in the flow diagram of FIG. 8.

Where either additional testing is not to be performed (block 905) or the additional testing is to be completed (block 910), an initial q circulant (e.g., q 715 of FIG. 7) is selected and included for each of the values of $R_j$ in the H2 matrix (block 920). The resulting combined H1 and H2 matrices (i.e., the H matrix) is tested for trapping sets (block 925). It is then determined if any of the identified trappings sets yields a value that is greater than a threshold (block 930). Where identified trapping sets are greater than the threshold (block 930), it is more easily detected. As such, the H matrix is considered complete and the combination of the H2 matrix and H1 matrix including the selected circulant is provided as an output (block 935). Alternatively, where identified trapping sets are not greater than the threshold (block 930), the column of the H matrix (i.e., the combination of the H1 matrix and the H2 matrix) with the trapping set yielding the smallest value is selected (block 940). A new circulant for the R value of the selected column is selected (block 945). Using this new circulant, the process of testing for trapping sets is repeated (block 945).

Figure 10:
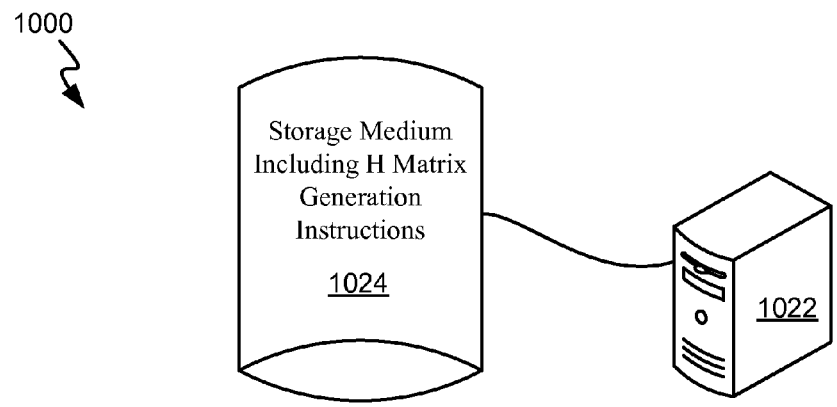
FIG. 10 depicts a code generation system in accordance with some embodiments of the present invention.

Turning to FIG. 10, a code generation system 1000 is shown in accordance with some embodiments of the present invention. Code generation system 1000 includes a computer 1022 and a computer readable medium 1024. Computer 1022 may be any processor based device known in the art. Computer readable medium 1024 may be any medium known in the art including, but not limited to, a random access memory, a hard disk drive, a tape drive, an optical storage device or any other device or combination of devices that is capable of storing data. Computer readable medium includes instructions executable by computer 1022 to generate an H matrix. Such instructions may cause the method of FIGS. 7-8 to be performed resulting in an H matrix with reduced trapping sets. In some cases, the instructions may be software instructions. Based upon the disclosure provided herein, one of ordinary skill in the art will recognize other types of instructions that may be used in relation to different embodiments of the present invention.

Figure 11:
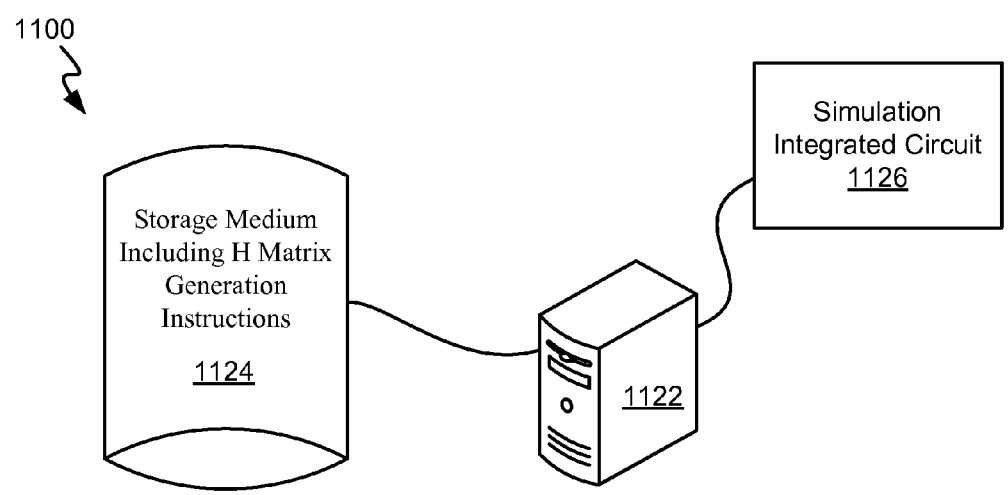
FIG. 11 depicts another code generation system in accordance with other embodiments of the present invention.

Turning to FIG. 11, another code generation system 1100 is shown in accordance with other embodiments of the present invention. Code generation system 1100 includes a computer 1122 and a computer readable medium 1124. Computer 1122 may be any processor based device known in the art. Computer readable medium 1124 may be any medium known in the art including, but not limited to, a random access memory, a hard disk drive, a tape drive, an optical storage device or any other device or combination of devices that is capable of storing data. Computer readable medium includes instructions executable by computer 1122 to generate an H matrix. Such instructions may cause the method of FIGS. 8-9 to be performed resulting in an H matrix with reduced trapping sets. In some cases, the instructions may be software instructions. Based upon the disclosure provided herein, one of ordinary skill in the art will recognize other types of instructions that may be used in relation to different embodiments of the present invention.

In addition, code generation system 1100 includes a simulation integrated circuit 1126. Simulation integration circuit 1126 may perform one or more of the processes set forth in the flow diagrams of FIGS. 8-9 that are more efficiently performed in hardware. For example, simulation integrated circuit 1126 may perform the processes of performing noise injected simulation to expose additional trapping sets. In such a case, the H1 matrix generated in software is used to encode a codeword by computer 1122, and the encoded word is provided to simulation integrated circuit 1126 where noise is added and the decoding process is performed. Simulation integrated circuit 1126 includes additional circuitry to identify and record the occurrence of additional trapping sets. As such, simulation integrated circuit 1126 includes some of the circuitry discussed above in relation to FIG. 2. It should be noted that other functions of FIGS. 8-9 may be performed by simulation integrated circuit 1126. Based upon the disclosure provided herein, one of ordinary skill in the art will appreciate a variety of distributions of work between computer 1122 executing instructions and simulation integrated circuit 1126.

In conclusion, the invention provides novel systems, devices, methods and arrangements for quasi-cyclic low density parity check data processing; and systems, devices, methods and arrangements for generating matrices with reduced trapping sets. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for generating a code format, the method comprising:
    receiving a first matrix having a row width and a column height, wherein the column height is greater than one;
    incorporating a circulant into a first column of the first matrix;
    testing the first column for trapping sets, wherein at least one trapping set is identified;
    selecting a value to mitigate the identified trapping set; and
    augmenting the first matrix with a second matrix to yield a composite matrix, wherein the second matrix has the selected value in the first column, and wherein the identified trapping set is mitigated.

2. The method of claim 1, wherein the second matrix has the column width.

3. The method of claim 2, wherein the row height is a first row height, wherein the second matrix has a second row height.

4. The method of claim 3, wherein the second row height is equal to one.

5. The method of claim 1, wherein the circulant is a first circulant, and wherein the value is a second circulant.

6. The method of claim 1, wherein testing the first column for trapping sets yields a single trapping set, wherein the circulant is a first circulant, and wherein the method further comprises:
    incorporating a second circulant into the first column of the first matrix;
    re-testing the first column for trapping sets, wherein more than one trapping sets are identified; and
    selecting the first circulant for inclusion in the first column based at least in part on the single trapping set compared with the more than one trapping set.

7. The method of claim 1, wherein selecting the value to mitigate the identified trapping set includes:
    selecting a first circulant as the value;
    testing the composite matrix for trapping sets wherein a first number of trapping sets are identified;
    selecting a second circulant as the value;
    re-testing the composite matrix for trapping sets wherein a second number of trapping sets are identified; and
    selecting one of the first circulant and the second circulant as the value based on a comparison of the first number of trapping sets and the second number of trapping sets.

8. The method of claim 1, wherein the method is at least in part performed by a processor executing instructions.

9. The method of claim 1, wherein the method is at least in part performed by an integrated circuit.

10. A system for generating a code format, the system comprising:
    a non-transitory computer readable medium, the computer readable medium including instructions executable by a processor to:
    receive a first matrix having a row width and a column height, wherein the column height is greater than one;
    incorporate a circulant into a first column of the first matrix;
    test the first column for trapping sets, wherein at least one trapping set is identified;
    select a value to mitigate the identified trapping set; and
    augment the first matrix with a second matrix to yield a composite matrix, wherein the second matrix has the selected value in the first column, and wherein the identified trapping set is mitigated.

11. The system of claim 10, wherein testing the first column for trapping sets yields a single trapping set, wherein the circulant is a first circulant, and wherein the computer readable medium further includes instructions executable by a processor to:
    incorporate a second circulant into the first column of the first matrix;
    re-test the first column for trapping sets, wherein more than one trapping sets are identified; and
    select the first circulant for inclusion in the first column based at least in part on the single trapping set compared with the more than one trapping set.

12. The system of claim 10, wherein the instructions executable by a processor to select the value to mitigate the identified trapping set include instructions executable by the processor to:
    select a first circulant as the value;
    test the composite matrix for trapping sets wherein a first number of trapping sets are identified;
    select a second circulant as the value;
    re-test the composite matrix for trapping sets wherein a second number of trapping sets are identified; and
    select one of the first circulant and the second circulant as the value based on a comparison of the first number of trapping sets and the second number of trapping sets.

13. The system of claim 10, wherein the second matrix has the column width, wherein the row height is a first row height, and wherein the second matrix has a second row height equal to one.

14. The system of claim 10, wherein the circulant is a first circulant, and wherein the value is a second circulant.

15. The system of claim 10, wherein the system further comprises:
    an integrated circuit operable to receive at least a portion of the first matrix and to test the portion for trapping sets, and
    wherein the instructions executable by a processor to test the first column for trapping sets includes instructions executable by the processor to provide the first matrix to the integrated circuit and to receive an indication of the at least one trapping set from the integrated circuit.

16. A system for generating a code format, the system comprising:

a non-transitory computer readable medium, the computer readable medium including instructions executable by a processor;

an integrated circuit; and wherein the combination of the instructions executable by the processor and the integrated circuit are operable to:

receive a first matrix having a row width and a column height, wherein the column height is greater than one;

incorporate a circulant into a first column of the first matrix;

test the first column for trapping sets, wherein at least one trapping set is identified;

select a value to mitigate the identified trapping set; and augment the first matrix with a second matrix to yield a composite matrix, wherein the second matrix has the selected value in the first column, and wherein the identified trapping set is mitigated.

17. The system of claim 16, wherein testing the first column for trapping sets yields a single trapping set, wherein the circulant is a first circulant, and the combination of the instructions executable by the processor and the integrated circuit are operable to:

incorporate a second circulant into the first column of the first matrix;

re-test the first column for trapping sets, wherein more than one trapping sets are identified; and select the first circulant for inclusion in the first column based at least in part on the single trapping set compared with the more than one trapping set.

18. The system of claim 16, wherein the combination of the instructions executable by the processor and the integrated circuit to select the value to mitigate the identified trapping set include instructions executable by the processor to:

select a first circulant as the value;

test the composite matrix for trapping sets wherein a first number of trapping sets are identified;

select a second circulant as the value;

re-test the composite matrix for trapping sets wherein a second number of trapping sets are identified; and select one of the first circulant and the second circulant as the value based on a comparison of the first number of trapping sets and the second number of trapping sets.

19. The system of claim 16, wherein the circulant is a first circulant, and wherein the value is a second circulant.

20. The system of claim 16, wherein the second matrix has the column width, wherein the row height is a first row height, and wherein the second matrix has a second row height equal to one.

* * * * *